(12) United States Patent
Larsen et al.

(10) Patent No.: US 11,489,548 B2
(45) Date of Patent: Nov. 1, 2022

(54) RADIO FREQUENCY SWITCHING CIRCUIT WITH HOT-SWITCHING IMMUNITY

(71) Applicant: Motorola Solutions, Inc, Chicago, IL (US)

(72) Inventors: Anders Stensgaard Larsen, Hillerod (DK); Mitchell R. Blozinski, Lake In The Hills, IL (US); Daniel Studer, Hawthorn Woods, IL (US)

(73) Assignee: Motorola Solutions, Inc., Chicago, IL (US)

( * ) Notice: Subject to any disclaimer, the term of this patent is extended or adjusted under 35 U.S.C. 154(b) by 0 days.

(21) Appl. No.: 17/472,064

(22) Filed: Sep. 10, 2021

(65) Prior Publication Data

US 2021/0409044 A1 Dec. 30, 2021

Related U.S. Application Data

(63) Continuation of application No. 16/716,782, filed on Dec. 17, 2019, now Pat. No. 11,165,452.

(51) Int. Cl.
*H04B 1/04* (2006.01)
*H03F 3/21* (2006.01)
*H03K 17/56* (2006.01)

(52) U.S. Cl.
CPC ............. *H04B 1/0458* (2013.01); *H03F 3/21* (2013.01); *H03K 17/56* (2013.01); *H03F 2200/451* (2013.01)

(58) Field of Classification Search
CPC .. H04B 1/0458; H04B 1/0475; H04B 1/0483; H03F 3/21; H03F 2200/451; H03F 3/189; H03F 3/20; H03K 17/56; H03K 17/51
See application file for complete search history.

(56) References Cited

U.S. PATENT DOCUMENTS

| | | |
|---|---|---|
| 4,249,150 A | 2/1981 | Bickley et al. |
| 4,510,472 A | 4/1985 | Bickley et al. |
| 5,060,293 A | 10/1991 | Kok et al. |
| 6,552,626 B2 | 4/2003 | Sharpe et al. |
| 10,855,073 B2 | 12/2020 | Fitzgerald |
| 2004/0113713 A1 | 6/2004 | Zipper |

*Primary Examiner* — Jung Kim
(74) *Attorney, Agent, or Firm* — Baker Botts L.L.P.; Michael A. Sartori

(57) ABSTRACT

Apparatus and methods for providing hot-switching immunity for radio frequency switching circuits are disclosed. A radio frequency switching circuit may include both a mechanical switch and a solid-state switch. The mechanical switch may be configurable to couple an output path of a power amplifier to a subsequent component in its transmission path when in a first mechanical switch state and to decouple the output path of the power amplifier from the subsequent component when in a second mechanical switch state. The solid-state switch may be configurable to operatively decouple the mechanical switch from a radio frequency power source when in a first solid-state switch state but not when in a second solid-state switch state. The solid-state switch may be in the first solid-state switch state during transitions of the mechanical switch between the first and second mechanical switch states.

25 Claims, 16 Drawing Sheets

RADIO FREQUENCY SWITCHING CIRCUIT WITH HOT-SWITCHING IMMUNITY

PRIORITY CLAIM

The present application is a continuation of U.S. patent application Ser. No. 16/716,782 filed Dec. 17, 2019, now U.S. Pat. No. 11,165,452 issued Nov. 2, 2021, the contents of which is incorporated by reference herein in its entirety.

BACKGROUND OF THE INVENTION

Radio Frequency (RF) communication systems pervade the modern world, connecting an ever-growing array of devices and services for a variety of consumer, industrial, and defense applications. The proliferation of legacy and new RF communication standards, along with the adoption of frequency and modulation-agile Software Defined Radio (SDR) technology, allows communications systems to support a broad frequency range and modulation library, even on commodity level hardware. For certain communications system and devices, there may be a requirement to support high power hot-switching, in which radio frequency signal switching is performed while the system or device is powered on and operating and, at the same time, very aggressive intermodulation distortion (IMD) performance requirements.

Existing high power RF switching circuits are susceptible to hot-switching problems or poor IMD performance. For example, the repeated hot-switching of a relay can have a major impact on the life of the relay. Relays that perform hot-switching of signals run hotter than relays that do not perform hot-switching, and their contacts erode much faster than the contacts of relays that do not perform hot-switching. In addition, mechanical relays can be prone to silicon deposition on the contacts when arcing during hot-switching in a silicon vapor rich environment. These factors can cause relays that perform hot-switching to fail faster than relays that do not perform hot-switching. Solid-state switches, such as PIN diodes, while capable of supporting hot-switching without experiencing reliability issues, are not capable of achieving the low levels of IMD required in many RF transmitters.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
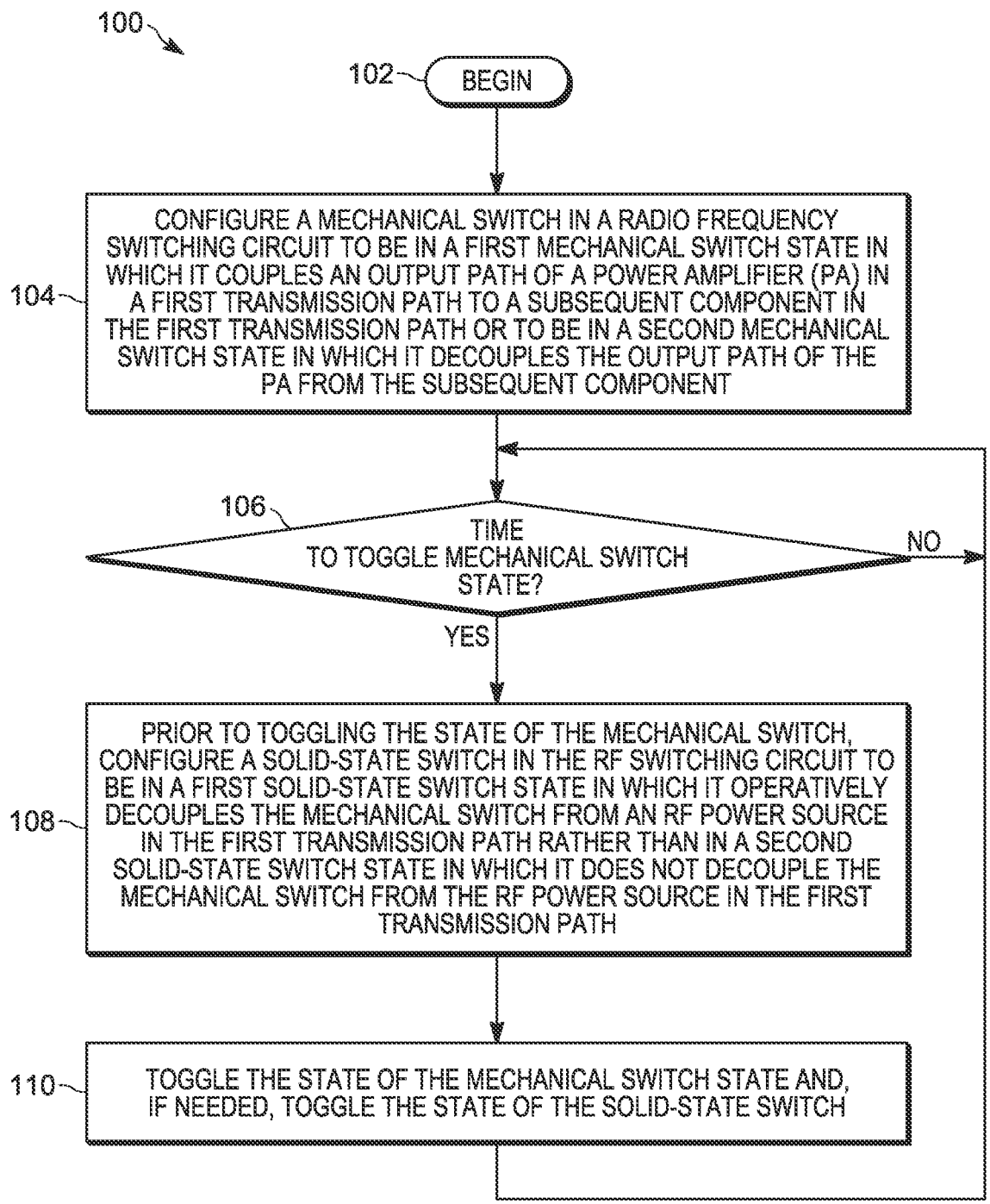
FIG. 1 is a flow diagram of selected elements of an example method for operating a radio frequency switching circuit including both a mechanical switch and a solid-state switch for hot-switching immunity, in accordance with some embodiments

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Disclosed herein are apparatus and methods for providing hot-switching immunity for radio frequency switching circuits. In one embodiment, a disclosed radio frequency switching circuit includes a mechanical switch configured to operatively couple an output path of a power amplifier in a first transmission path to a subsequent component in the first transmission path when in a first mechanical switch state and to operatively decouple the output path of the power amplifier from the subsequent component in the first transmission path when in a second mechanical switch state and a solid-state switch configured to operatively decouple the mechanical switch from a radio frequency power source in the first transmission path when in a first solid-state switch state and not decouple the mechanical switch from the radio frequency power source in the first transmission path when in a second solid-state switch state. The solid-state switch is configured to be in the first solid-state switch state during transitions of the mechanical switch from the first mechanical switch state to the second mechanical switch state and from the second mechanical switch state to the first mechanical switch state.

In at least some embodiments, to operatively decouple the mechanical switch from the radio frequency power source in the first transmission path when in the first solid-state switch state, the solid-state switch may be configured to impart a first impedance lower than a second impedance at a pin of the mechanical switch. The solid-state switch may be configured to impart the second impedance higher than the first impedance at the pin of the mechanical switch when in the second solid-state switch state.

In various embodiments, the solid-state switch may be configured to be in the second solid-state switch state while the mechanical switch is in the first mechanical switch state and the solid-state switch may be configured to be in the second solid-state switch state while the mechanical switch is in the second mechanical switch state. In various embodiments, the solid-state switch may be configured to be in the first solid-state switch state while the mechanical switch is in the first mechanical switch state and the solid-state switch may be configured to be in the second solid-state switch state while the mechanical switch is in the second mechanical switch state. In various embodiments, the solid-state switch may be configured to be in the first solid-state switch state while the mechanical switch is in the second mechanical switch state and the solid-state switch may be configured to be in the second solid-state switch state while the mechanical switch is in the first mechanical switch state. In various embodiments, the solid-state switch may be configured to be in the first solid-state switch state while the mechanical switch is in the first mechanical switch state and the solid-state switch may be configured to be in the first solid-state switch state while the mechanical switch is in the second mechanical switch state.

In various embodiments, the respective positions of the mechanical switch when in the first mechanical switch state and when in the second mechanical switch state may be dependent on the length of a second transmission path between a point at which the output path of the power amplifier is decoupled from the subsequent component and the mechanical switch. For example, in some embodiments, the mechanical switch may be in a closed position when in the first mechanical switch state and may be in an open position when in the second mechanical switch state. In other embodiments, the mechanical switch may be in an open position when in the first mechanical switch state and may be in a closed position when in the second mechanical switch state.

In various embodiments, the mechanical switch may be positioned in a second transmission path parallel to the first transmission path and the solid-state switch is positioned in a third transmission path parallel to the second transmission path. In various embodiments, the solid-state switch may be positioned in a second transmission path parallel to the first transmission path and the radio frequency switching circuit may further include a substitution switch in a third transmission path parallel to the second transmission path. The substitution switch may be configured to operatively decouple the output path of the power amplifier from the subsequent component while no electrical power is supplied to the solid-state switch. The substitution switch may be or include an additional mechanical switch whose position when configured to operatively decouple the output path of the power amplifier from the subsequent component is dependent on the length of the third transmission path. In various embodiments, the mechanical switch may be positioned in series with the output path of the power amplifier in the first transmission path and the solid-state switch may be positioned in a second transmission path parallel to the first transmission path.

In various embodiments, the respective open circuit or closed circuit states of the solid-state switch when in the first solid-state switch state and when in the second solid-state switch state may be dependent on the length of a second transmission path between the solid-state switch and a point at which the mechanical switch is operatively decoupled from the radio frequency power source in the first transmission path when the solid-state switch is in the first solid-state switch state. For example, in some embodiments, the solid-state switch may be in a closed circuit state when in the first solid-state switch state and may be in an open circuit state when in the second solid-state switch state. In other embodiments, the solid-state switch may be in an open circuit state when in the first solid-state switch state and may be in a closed circuit state when in the second solid-state switch state.

In some embodiments, the radio frequency switching circuit may further include an intermediate mechanical switch, a second transmission path between the output path of the power amplifier and the mechanical switch, a third transmission path between the output path of the power amplifier and the solid-state switch, and a fourth transmission path between the output path of the power amplifier and the intermediate mechanical switch, the second transmission path being parallel to the third transmission path and to the fourth transmission path. To operatively decouple the mechanical switch from the radio frequency power source in the first transmission path when in the first solid-state switch state, the solid-state switch may be configured to impart a first impedance lower than a second impedance at a pin of the intermediate mechanical switch, and the intermediate mechanical switch may be configured to impart a third impedance at a pin of the mechanical switch lower than a fourth impedance imparted at the pin of the mechanical switch when the mechanical switch is not decoupled from the from the radio frequency power source. The solid-state switch may be further configured to impart the second impedance higher than the first impedance at the pin of the intermediate mechanical switch when in the second solid-state switch state.

In one embodiment, a disclosed method for operating a radio frequency switching circuit includes configuring a mechanical switch in the radio frequency switching circuit to be in a first mechanical switch state in which the mechanical switch operatively couples an output path of a power amplifier in a first transmission path to a subsequent component in the first transmission path, configuring a solid-state switch in the radio frequency switching circuit to be in a first solid-state switch state in which the solid-state switch operatively decouples the mechanical switch from a radio frequency power source in the first transmission path rather than in a second solid-state switch state in which the solid-state switch does not decouple the mechanical switch from the radio frequency power source in the first transmission path, and subsequent to configuring the solid-state switch to be in the first solid-state switch state, toggling the state of the mechanical switch from the first mechanical switch state to a second mechanical switch state in which the mechanical switch operatively decouples the output path of the power amplifier from the subsequent component in the first transmission path.

In at least some embodiments, configuring the solid-state switch to be in the first solid-state switch state may include configuring the solid-state switch to impart a first impedance at a pin of the mechanical switch lower than a second impedance imparted by the solid-state switch at the pin of the mechanical switch when the solid-state switch is in the second solid-state switch state.

In various embodiments, the method may further include, prior to configuring the solid-state switch to be in the first solid-state switch state, operating the radio frequency switching circuit in a power amplifier enabled state in which the output path of the power amplifier is coupled to the subsequent component and the state of the solid-state switch is dependent on the length of a second transmission path between the solid-state switch and a point at which the mechanical switch is operatively decoupled from the radio frequency power source in the first transmission path when the solid-state switch is in the first solid-state switch state.

In various embodiments, the method may further include, subsequent to toggling the state of the mechanical switch from the first mechanical switch state to the second mechanical switch state, operating the radio frequency switching circuit in a power amplifier disabled state in which the output path of the power amplifier is decoupled from the subsequent component and the state of the solid-state switch is dependent on the length of a second transmission path between the solid-state switch and a point at which the mechanical switch is operatively decoupled from the radio frequency power source in the first transmission path when the solid-state switch is in the first solid-state switch state.

In various embodiment, the method may further include, subsequent to toggling the state of the mechanical switch from the first mechanical switch state to the second mechanical switch state, configuring the solid-state switch to be in the first solid-state switch state and, subsequent to configuring the solid-state switch to be in the first solid-state switch state, toggling the state of the mechanical switch from the second mechanical switch state to the first mechanical switch state.

In various embodiments, the solid-state switch may be positioned in a second transmission path parallel to the first transmission path and the method may further include configuring a substitution switch in a third transmission path parallel to the second transmission path to operatively decouple the output path of the power amplifier from the subsequent component while no electrical power is supplied to the solid-state switch.

In various embodiments, the method may further include configuring a second transmission path between the output path of the power amplifier and the mechanical switch to be in parallel with a third transmission path between the output path of the power amplifier and an intermediate mechanical switch and in parallel with a fourth transmission path between the output path of the power amplifier and the solid-state switch. Operatively decoupling the mechanical switch from the radio frequency power source in the first transmission path when in the first solid-state switch state may include configuring the solid-state switch to impart a first impedance at a pin of the intermediate mechanical switch lower than a second impedance imparted by the solid-state switch at the pin of the intermediate mechanical switch when in the second solid-state switch state and configuring the intermediate mechanical switch to impart a third impedance at a pin of the mechanical switch lower than a fourth impedance imparted at the pin of the mechanical switch when the mechanical switch is not decoupled from the from the radio frequency power source by the intermediate mechanical switch.

In one embodiment, a disclosed electronic communication device includes a first power amplifier and a first radio frequency switching circuit. The first radio frequency switching circuit includes a first mechanical switch configured to operatively couple an output path of the first power amplifier in a first transmission path to an antenna when in a first mechanical switch state and to operatively decouple the output path of the first power amplifier from the antenna when in a second mechanical switch state and a first solid-state switch configured to operatively decouple the first mechanical switch from a radio frequency power source in the first transmission path when in a first solid-state switch state and not decouple the first mechanical switch from the radio frequency power source in the first transmission path when in a second solid-state switch state. The first solid-state switch is configured to be in the first solid-state switch state during transitions of the first mechanical switch from the first mechanical switch state to the second mechanical switch state and from the second mechanical switch state to the first mechanical switch state.

In at least some embodiments, to operatively decouple the first mechanical switch from the radio frequency power source in the first transmission path when in the first solid-state switch state, the first solid-state switch may be configured to impart a first impedance lower than a second impedance at a pin of the first mechanical switch. The first solid-state switch may be configured to impart the second impedance higher than the first impedance at the pin of the first mechanical switch when in a second solid-state switch state.

In various embodiments, the respective solid-state switch states in which the first solid-state switch is configured and the respective open circuit or closed circuit states of the first solid-state switch while the first mechanical switch is in the first mechanical switch state and while the first mechanical switch is in the second mechanical switch state may be dependent on the length of a second transmission path between the first solid-state switch and a point at which the first mechanical switch is operatively decoupled from the radio frequency power source in the first transmission path when the first solid-state switch is in the first solid-state switch state. The respective positions of the first mechanical switch when in the first mechanical switch state and when in the second mechanical switch state may be dependent on the length of a second transmission path between a point at which the output path of the first power amplifier is decoupled from the antenna and the first mechanical switch.

In various embodiments, the first solid-state switch may be positioned in a second transmission path parallel to the first transmission path and the radio frequency switching circuit may further include a substitution switch in a third transmission path parallel to the second transmission path, the substitution switch configured to operatively decouple the output path of the first power amplifier from the antenna while no electrical power is supplied to the first solid-state switch. The substitution switch may be or include an additional mechanical switch whose position when configured to operatively decouple the output path of the first power amplifier from the antenna is dependent on the length of the third transmission path.

In various embodiments, the electronic communication device may further include a second power amplifier and a second radio frequency switching circuit. The second radio frequency switching circuit may include a second mechanical switch configured to operatively couple an output path of the second power amplifier in a second transmission path to an antenna when in a third mechanical switch state and to operatively decouple the output path of the second power amplifier from the antenna when in a fourth mechanical switch state and a second solid-state switch configured to operatively decouple the second mechanical switch from a radio frequency power source in the second transmission path when in a third solid-state switch state and not decouple the second mechanical switch from the radio frequency power source in the second transmission path when in a fourth solid-state switch state. The second solid-state switch may be configured to be in the third solid-state switch state during transitions of the second mechanical switch from the third mechanical switch state to the fourth mechanical switch state and from the fourth mechanical switch state to the third mechanical switch state.

As previously noted, existing high power RF switching circuits are susceptible to hot-switching problems or poor IMD performance. In these circuits, RF switching in the range of 100 W RMS and 1 KW peak power is traditionally implemented using either solid-state switches, such as RF PIN diodes, or using mechanical switches, such as mechanical relays. However, there are advantages and disadvantages to each of these approaches. For example, a mechanical relay RF switch operates satisfactorily in both ON and OFF states but can face problems with arcing during hot-switching of high power RF signals. It is, therefore, not an optimal solution in applications in which, due to being cycled between ON and OFF states for power savings or other reasons, the mechanical relay will be exposed to many switching operations during the life cycle of the system or device. A mechanical relay that is designed to handle high levels of hot-switching is typically very expensive.

A solid-state switch, such as a PIN diode RF switch, may be better able to handle high levels of hot-switching, since it does not experience problems with arcing. However, this RF switching approach results in both high power dissipation when in the ON state and poor IMD performance when in the ON or OFF state. In some cases, the power dissipation when in the ON state can be reduced by using more PIN diodes in parallel, but this may increase the IMD problem when in the OFF state since more diodes are producing distortion.

In various embodiments, apparatus and methods described herein for providing hot-switching immunity for radio frequency switching circuits may fulfill both power dissipation requirements when in the ON state and IMD requirements when in the ON and OFF state. The low-cost, high power RF switching circuits described herein may use a mechanical switch, such as a mechanical relay, in conjunction with a solid-state switch, such as an RF PIN diode, arranged in any of a variety of suitable topologies and sequenced such that benefits of each switch can be realized during states of operation in which the other switch has weakness. For example, the mechanical switch may reduce thermal stress on the solid-state switch during steady-state operation and may reduce or eliminate IMD that would otherwise be caused by the solid-state switch. The solid-state switch may reduce hot-switching stress on the mechanical switch during transitions from an open circuit condition to a short circuit condition or from a short circuit condition to an open circuit condition. While the solid-state switch may have significant IMD during transitions of the mechanical switch, this may not be considered a problem due to the switching time being of very short duration.

More specifically, each of the RF circuits described herein may include a mechanical switch that is configurable to impart a high impedance, or operatively decouple, the output path of a power amplifier when the RF circuit in a disabled state. Conversely, in an enabled state, the mechanical switch may be configurable to operatively couple the output path of the power amplifier to a subsequent component such as an antenna. Each of the RF circuits described herein may also include a solid-state switch that is configurable to attenuate the RF power to the mechanical relay when in a first solid-state switch state, effectively decoupling the RF power source from the mechanical relay, but not attenuating the RF power to the mechanical relay when in a second solid-state switch state. In various embodiments and at certain times, the RF power source may be the power amplifier itself, such as if the solid-state switch state is transitioned during transmission by the power amplifier. In other embodiments or at other times, the RF power source may be external to the power amplifier, such as when the RF switching circuit is operating in a system with a parallel power amplifier configuration and the power amplifier associated with the RF switching circuit is dekeyed prior to the transition of the solid-state switch state. In this case, the RF power to the mechanical switch may flow from other power amplifiers following the transition.

In embodiments in which the solid-state switch is connected in parallel to the mechanical switch, to attenuate the RF power and operatively decouple the mechanical switch from the RF power source, the solid-state switch may be configured to impart a low impedance, effectively a short circuit condition, between the RF power source in a first transmission path and the mechanical relay, such as at one or more pins of the mechanical switch. In such embodiments, the solid-state switch, when configured in the opposite state, may impart a high impedance, effectively an open circuit condition, at this same location between the RF power source in the first transmission path and the mechanical switch and not decouple the mechanical switch from the RF power source. Conversely, in embodiments in which the solid-state switch is connected in series with the mechanical switch, to attenuate the RF power and operatively decouple the mechanical switch from the RF power source, the solid-state switch may be configured to impart a high impedance, effectively an open circuit condition, at one or more pins of the mechanical switch. In such embodiments, the solid-state switch, when configured in the opposite state, may impart a low impedance, effectively a short circuit condition, between the RF power source in a first transmission path and the mechanical relay, such as at the pin(s) of the mechanical switch and not decouple the mechanical switch from the RF power source.

In at least some embodiments, the mechanical switch may only be exposed to very low RF power during the switching operation to transition between states. Because these RF switching circuits are not susceptible to arcing issues, a relatively low cost, low power class mechanical switch may be used, rather than a large, high power, high cost mechanical relay. In addition, the RF switching circuits described herein may have a much faster switching time than existing RF switching circuits that rely on high power mechanical relays due to the shorter switching times of the low power class mechanical switches. For example, the switching time for an existing RF switching circuit that includes a high power hot switch capable relay may, per specification, be on the order of 15 ms. The switching time for an RF switching circuit that includes lower power class relays, such as those usable in the RF switching circuits described herein, may, per specification, be on the order of 5 ms. Typical switching times may be faster than specified and may vary for switches across a wide range of different power classes.

As described in more detail below, the RF switching circuits described herein may, optionally, include a substitution switch that maintains a high impedance output state even when no electrical power is supplied to the solid-state switch. In this case, the substitution switch may operate in place of the solid-state switch to decouple the PA output, similar to the primary mechanical switch, since the solid-state switch may require DC power in order to provide the proper impedance for the decoupling. The substitution switch may also be used to provide a high impedance state in response to a hardware failure of the primary mechanical relay, such as for a failure mode over-ride mechanism, to reduce the power consumption of the solid-state switch at times other than during a transition of the primary mechanical switch, such as for enhanced performance, or at other times and under other conditions. Note that the usefulness of the substitution switch may be dependent on the particular topology of the RF switching circuit. For example, the substitution switch may only be useful when the transmission path in which the primary mechanical switch is positioned is parallel to the transmission path between the PA output and a subsequent component, since a primary mechanical switch in a series configuration may be configured to be able to be forced to open without any electrical power supplied by design.

In embodiments in which the mechanical switch is positioned in series with the power amplifier in the first transmission path, the mechanical switch may be capable of directly imparting a high impedance, effectively an open circuit condition, into the first transmission path when operating in the second mechanical switch state, which is the PA disabled state, and may be configured to be in a closed circuit state when operating in the PA enabled state.

In embodiments in which the mechanical switch is positioned in a second transmission path parallel to the first transmission path, the mechanical switch may be capable of imparting a low impedance, effectively a short circuit condition, into the first transmission path when operating in the second mechanical switch state. This short circuit condition may subsequently be transformed to an open circuit condition in the first transmission path. In such embodiments, the respective mechanical switch states when operating in the PA disabled state and in the PA enabled state may be dependent on the length of a transmission path between the mechanical switch and the point at which the output path of the power amplifier is decoupled from a subsequent component in the first transmission path by the mechanical switch.

In some embodiments, when the solid-state switch is operating in the first solid-state switch state, the impedance imparted at the pin of the mechanical switch is lower than the impedance imparted when operating in the second solid-state switch state, which may result in reduced electrical stress, or lower RF power, at the pin of the mechanical switch when RF energy is present. In some embodiments, the RF power to which the mechanical switch is exposed using this technique may be reduced by 20 dB to 30 dB or more. The lower impedance imparted at the pin of the mechanical switch when the solid-state switch is in its first switch state may reduce both voltage and current exposure to the mechanical switch.

Electrical delay elements, such as quarter-wave transmission lines, can transform low impedances that are effectively short circuits to high impedances that are effectively open circuits, and vice versa. Therefore, in some embodiments, the individual states of the solid-state switch and the mechanical switch for a given operational state may be controlled by the selection and number of delay elements included in the transmission path between the first solid-state switch and a point at which the first mechanical switch is operatively decoupled from the radio frequency power source and in the transmission path between the mechanical switch and the point at which the output path of the power amplifier is decoupled from a subsequent component in the first transmission path. In various embodiments, each quarter-wave transmission line may, for example, have an impedance of 50 ohms, 75 ohms, 100 ohms, or another amount, depending on system characteristics or to optimize performance.

Referring now to FIG. 1, there is provided a flow diagram of selected elements of an example method 100 for operating a radio frequency switching circuit including both a mechanical switch and a solid-state switch for hot-switching immunity, in accordance with some embodiments. In some embodiments, the mechanical switch may be a mechanical relay and the solid-state switch may be a PIN diode switch. In other embodiments, the solid-state switch may be or include another type of solid-state switch, such as a MOSFET, a bipolar junction transistor (BJT), or another type of transistor that can be operated in a switched fashion, such as between cutoff and saturation states. In other embodiments, the mechanical switch may be or include another type of electromechanically actuated switch having one or more poles, rather than a mechanical relay.

While a particular order of operations is indicated in FIG. 1 for illustrative purposes, the timing and ordering of such operations may vary where appropriate without negating the purpose and advantages of the examples set forth in detail throughout the remainder of this disclosure. In various embodiments, some or all of the operations of method 100 may be controlled by a processing unit within a base station, a mobile station, or another device configured to transmit and, in some cases, receive baseband signals.

In this example embodiment, method 100 begins with block 102 and continues at block 104 with configuring a mechanical switch in a radio frequency switching circuit to be in a first mechanical switch state in which it couples an output path of a power amplifier (PA) in a first transmission path to a subsequent component in the first transmission path or to be in a second mechanical switch state in which it decouples the output path of the PA from the subsequent component. For example, in some embodiments, the first transmission path may be a transmission path between the PA and an antenna. The RF switching circuit also includes a solid-state switch.

If and when, at 106, it is determined that the state of the mechanical switch is to be toggled, method 100 continues to 108 where, prior to toggling the state of the mechanical switch, the solid-state switch in the RF switching circuit is configured to be in a first solid-state switch state in which it operatively decouples the mechanical switch from an RF power source in the first transmission path rather than in a second solid-state switch state in which it does not decouple the mechanical switch from the RF power source in the first transmission path. For example, in some embodiments, to operatively decouple the mechanical switch from the RF power source, the solid-state switch may be configured to impart a low impedance at a pin of the mechanical switch rather than to impart a high impedance at the pin of the mechanical switch.

At 110, method 100 includes toggling the state of the mechanical switch state and, if needed, toggling the state of the solid-state switch. For example, in some embodiments, the state of the solid-state switch when the mechanical switch is in the first mechanical switch state and the state of the solid-state switch when the mechanical switch is in the second mechanical switch state may be dependent on the state of the mechanical switch. In some embodiments, the solid-state switch may be configured to be in the first solid-state switch state while the mechanical switch is in transition between the first and second mechanical switch states and to be in the second solid-state switch state while the mechanical switch is in either the first mechanical switch state or the second mechanical switch state. In other embodiments, the solid-state switch may be configured to be in the first solid-state switch state while the mechanical switch is in transition between the first and second mechanical switch states and while the mechanical switch is in one of the first and second mechanical switch states and to be in the second solid-state switch state while the mechanical switch is in the other one of the first and second mechanical switch states. In at least some embodiments, the state of the solid-state switch may be dependent on the length of a transmission path between the pin of the mechanical switch and the solid-state switch.

As illustrated in FIG. 1, in at least some embodiments, some or all of the operations of method 100 may be repeated one or more times during operation of the RF switching circuit.

In the circuit diagrams shown in FIGS. 7A-7B, 8A-8D, 9A-9B, 10A-10B, 11A-11B, and 12A-12C and the descriptions thereof that follow, the mechanical switch and the solid-state switch will have finite electrical length, and compensation in the circuit connections, such as in the lengths of the transmission lines between various circuit components, may be required. For example, such compensation may include the manipulation of circuit elements by the addition of one or more quarter-wave (90-degree) lengths of cabling, as appropriate. References to specific interconnecting line lengths to or from the switching elements in the figures are intended to be illustrative and not restrictive. For example, several of figures illustrate an ideal 90-degree transmission line. In practice, a 90-degree transmission path may include a cable that is less than a quarter-wave length with the remaining length being attributed to various components along the path. Similarly, several of the figures illustrate an ideal 180-degree transmission line. In practice, a 180-degree transmission path may include a cable that is less than two quarter-wave lengths with the remaining length being attributed to various components along the path Note that, for a 90-degree transmission line, if one end of the transmission line is shorted, there will be an open circuit condition at the other end of the line, and vice versa. The effect of a 90-degree path may thus be realized by a transmission path including any odd number of 90-degree segments or by a transmission path whose length is an odd multiple of 90 degrees. In the descriptions herein, the terms open circuit and closed circuit, when referring to impedances, are not intended to be literal, and are terms of art used to refer to very high and very low impedances respectively.

Figure 2A:
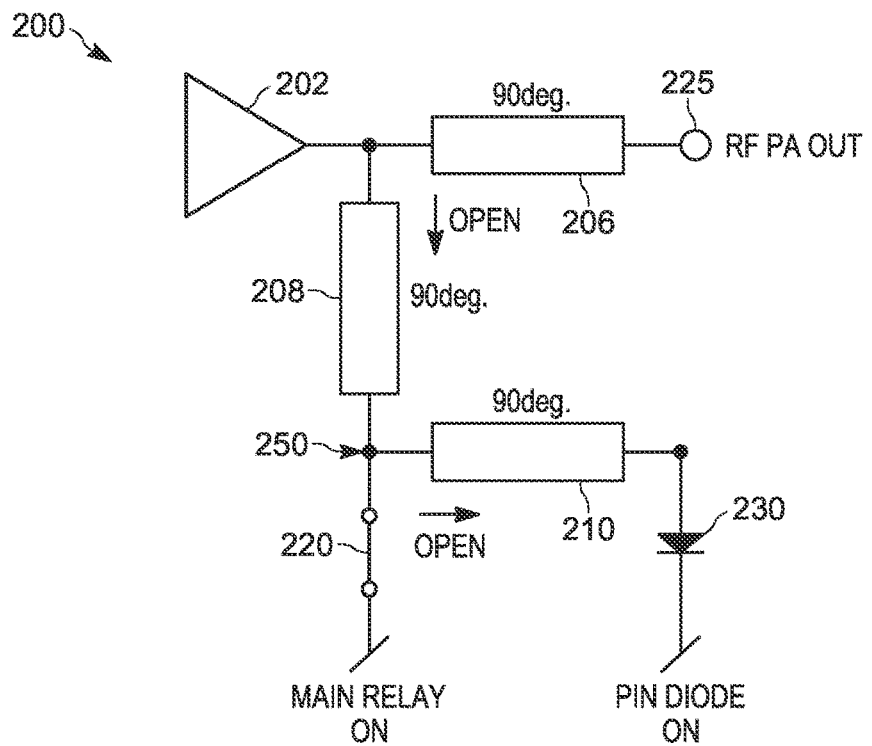
FIG. 2A is a circuit diagram illustrating selected elements of a radio frequency switching circuit including both a mechanical switch and a solid-state switch for hot-switching immunity and operating in a power amplifier enabled state, in accordance with a first embodiment.

FIG. 2A is a circuit diagram illustrating selected elements of a radio frequency (RF) switching circuit 200 including a mechanical switch and a solid-state switch for hot-switching immunity and operating in a power amplifier enabled state, in accordance with a first embodiment. In the illustrated embodiment, the mechanical switch 220 is a mechanical relay that serves as the primary switching control for RF switching circuit 200. In the illustrated embodiment, the solid-state switch 230 is a PIN diode switch that is ON, and thereby shorted, during both the PA enabled state and the PA disabled state resulting in an open circuit condition at the point at which the output path of the power amplifier 202 is coupled or decoupled from a subsequent component by the mechanical switch. In other embodiments, the solid-state switch 230 in RF switching circuit 200 may be or include another type of solid-state switch, such as a MOSFET, a bipolar junction transistor (BJT), or another type of transistor that can be operated in a switched fashion. In other embodiments, the mechanical switch 220 may be or include another type of electromechanically actuated switch having one or more poles, rather than a mechanical relay.

The RF switching circuit 200 couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state. The solid-state switch 230 is configured to impart a low impedance at a pin of the mechanical switch 220, shown as decoupling point 250, to operatively decouple the mechanical switch 220 from an RF power source when in a first solid-state switch state and to impart a higher impedance at the pin of the mechanical switch when in a second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 206 represents an ideal 90-degree transmission line in the first transmission path between power amplifier 202 and the output of RF switching circuit 200, shown as RF PA OUT 225. Transmission cable 208 represents an ideal 90-degree transmission line in a second transmission path between power amplifier 202 and mechanical switch 220, and transmission cable 210 represents an ideal 90-degree transmission line in a third transmission path between power amplifier 202 and solid-state switch 230.

In the illustrated embodiment, the solid-state switch 230 is configured to be in the second solid-state switch state while the mechanical switch 220 is in the first mechanical switch state and while the mechanical switch 220 is in the second mechanical switch state. In the illustrated embodiment, the mechanical switch 220 is in a closed position when in the first mechanical switch state and is in an open position when in the second mechanical switch state. In the illustrated embodiment, the solid-state switch 230 is in an open circuit state when in the first solid-state switch state and is in a closed circuit state when in the second solid-state switch state. In the illustrated embodiment, the mechanical switch 220 is positioned in the second transmission path parallel to the first transmission path and the solid-state switch 230 is positioned in the third transmission path parallel to the second transmission path.

In FIG. 2A, the radio frequency switching circuit 200 is operating in a power amplifier enabled state. In this example, the mechanical switch is in the first mechanical switch state and the solid-state switch is in the second solid-state switch state. In this PA enabled state, PA 202 delivers power to RF PA OUT 225 and any subsequent component(s) in the transmission path.

Figure 2B:
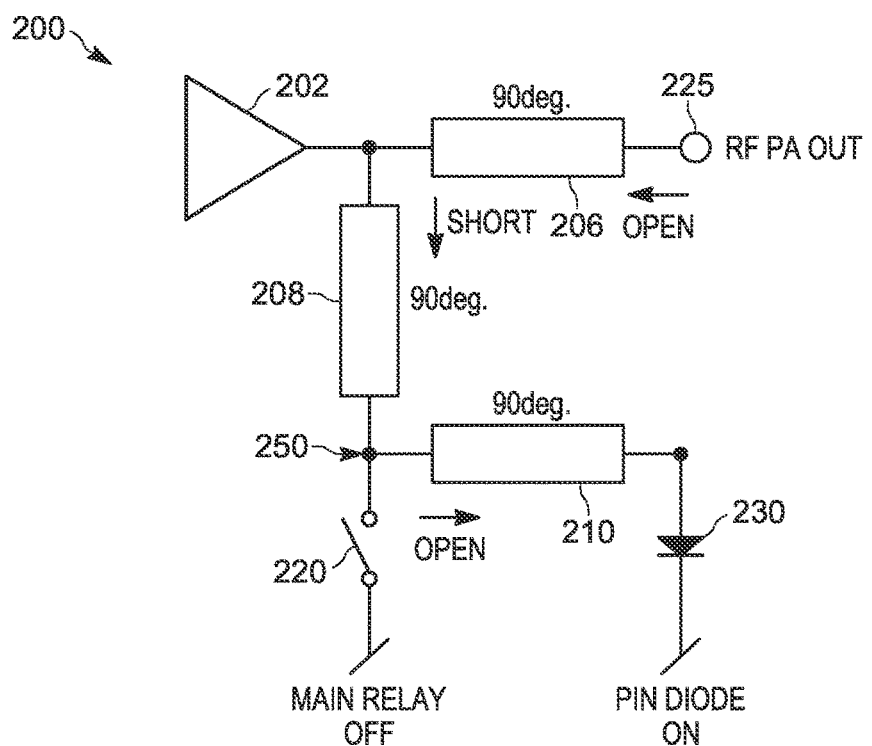
FIG. 2B is a circuit diagram illustrating selected elements of a radio frequency switching circuit including both a mechanical switch and a solid-state switch for hot-switching immunity and operating in a power amplifier disabled state, in accordance with the first embodiment.

FIG. 2B is a circuit diagram illustrating selected elements of radio frequency switching circuit 200 when operating in a power amplifier disabled state, in accordance with the first embodiment. In this example, the mechanical switch is in the second mechanical switch state and the solid-state switch is in the second solid-state switch state. In this PA disabled state, the power amplifier is decoupled from PA RF OUT 225.

Figure 3A:
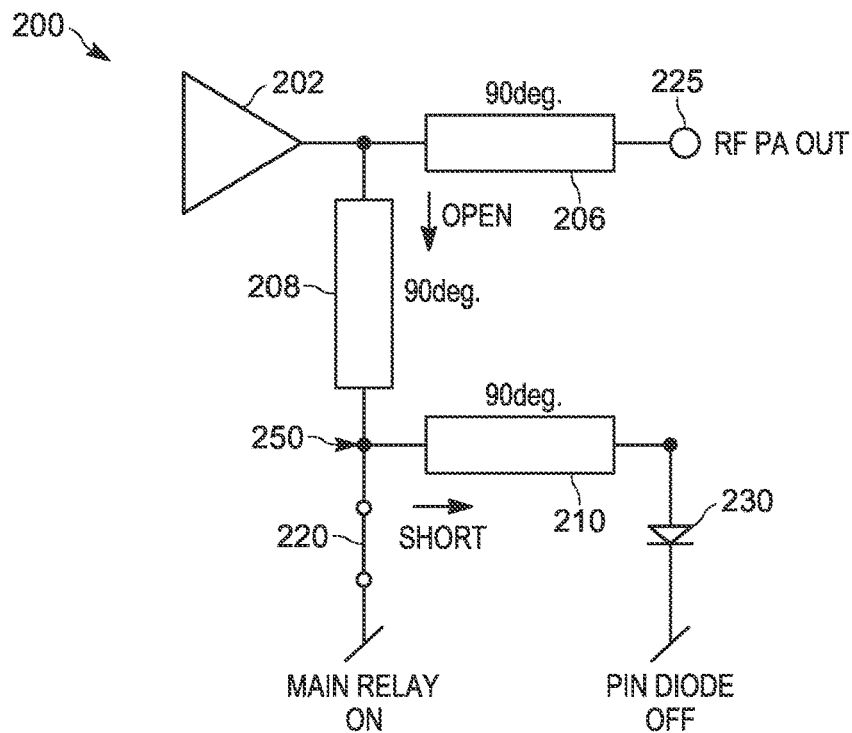
FIG. 3A is a circuit diagram illustrating selected elements of a radio frequency switching circuit including both a mechanical switch and a solid-state switch for hot-switching immunity during a transition from a power amplifier enabled state to a power amplifier disabled state, in accordance with the first embodiment.

FIG. 3A is a circuit diagram illustrating selected elements of radio frequency switching circuit 200 during a transition from a power amplifier enabled state to a power amplifier disabled state, in accordance with the first embodiment. In the illustrated embodiment, the solid-state switch 230 is a PIN diode switch that is OFF, and thereby open, during a transition from the PA enabled state to the PA disabled state resulting in a short circuit condition at the point at which the output path of the power amplifier 202 is coupled or decoupled from the mechanical switch, shown as decoupling point 250. In at least some embodiments, this will minimize the RF power at the mechanical switch, thereby reducing or eliminating the effects of high power hot-switching.

Figure 3B:
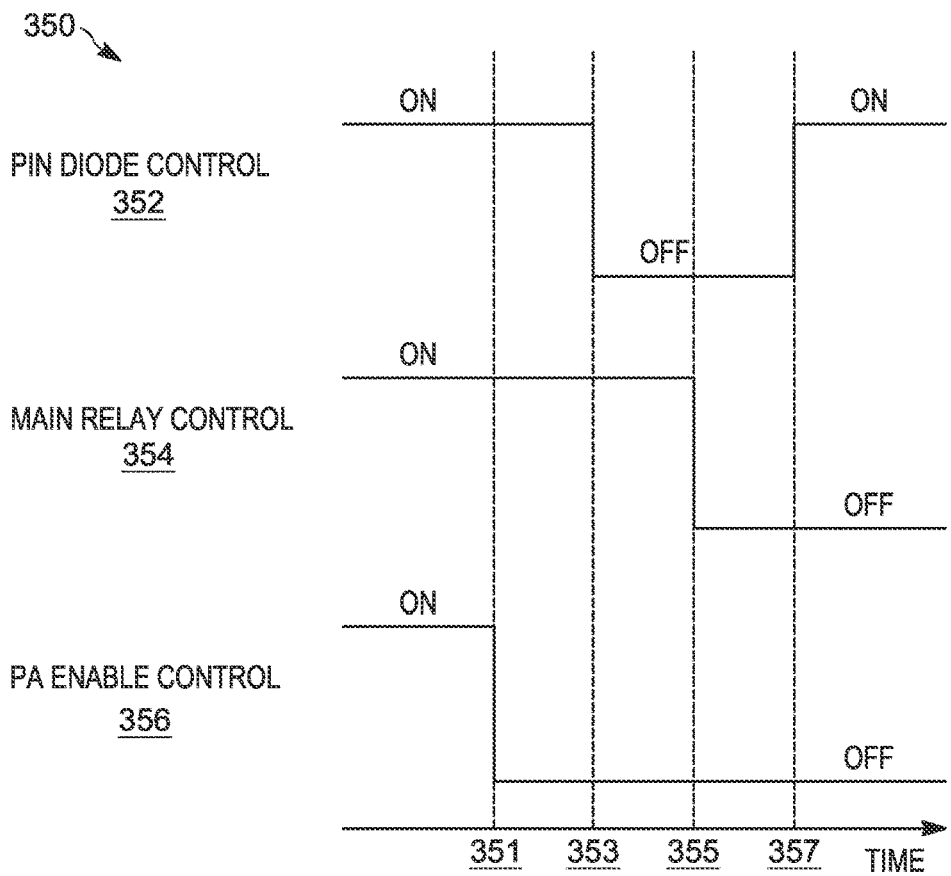
FIG. 3B is a timing diagram illustrating the respective states of a mechanical switch and a solid-state switch in a radio frequency switching circuit during a transition from a power amplifier enabled state to a power amplifier disabled state, in accordance with the first embodiment.

FIG. 3B is a timing diagram 350 illustrating the respective states of a mechanical switch and a solid-state switch in a radio frequency switching circuit during a transition from a power amplifier enabled state to a power amplifier disabled state, in accordance with the first embodiment. As illustrated in timing diagram 350, the sequencing of the switch states may be as follows: in response to a change in a PA enable control signal 356 indicating that the state of the RF switching circuit is to be changed from the power amplifier enabled state (ON) to the power amplifier disabled state (OFF) at time 351, and prior to toggling the state of a control signal for the mechanical switch, shown as main relay control 354, the state of a control signal for the solid-state switch, shown as PIN control 352, is toggled from its low impedance state (ON) to its high impedance state (OFF) at time 353.

In this example, while the solid-state switch is in its high impedance state (OFF), where a low impedance is thereby imparted at the pin of the mechanical relay, the main relay control 354 is toggled from the PA enabled state (ON) to the PA disabled state (OFF) at time 355. In this example, due to the topology of the RF switching circuit and the lengths of various transmission paths in the RF switching circuit, once the RF switching circuit is in the PA disabled state (OFF), the solid-state switch is returned to its low impedance state (ON) at time 357, where it presents a high impedance to the pin of the mechanical relay. In other embodiments, due again to the topology of the RF switching circuit and the lengths of various transmission paths in the RF switching circuit, the solid-state switch might remain in the high impedance state (OFF) while the RF switching circuit is in the PA disabled state. In one example embodiment, the period during which the solid-state switch is in the high impedance state (OFF) may be on the order of 10 milliseconds or less, depending on the switching time of the mechanical switch and the solid-state switch.

Figure 4:
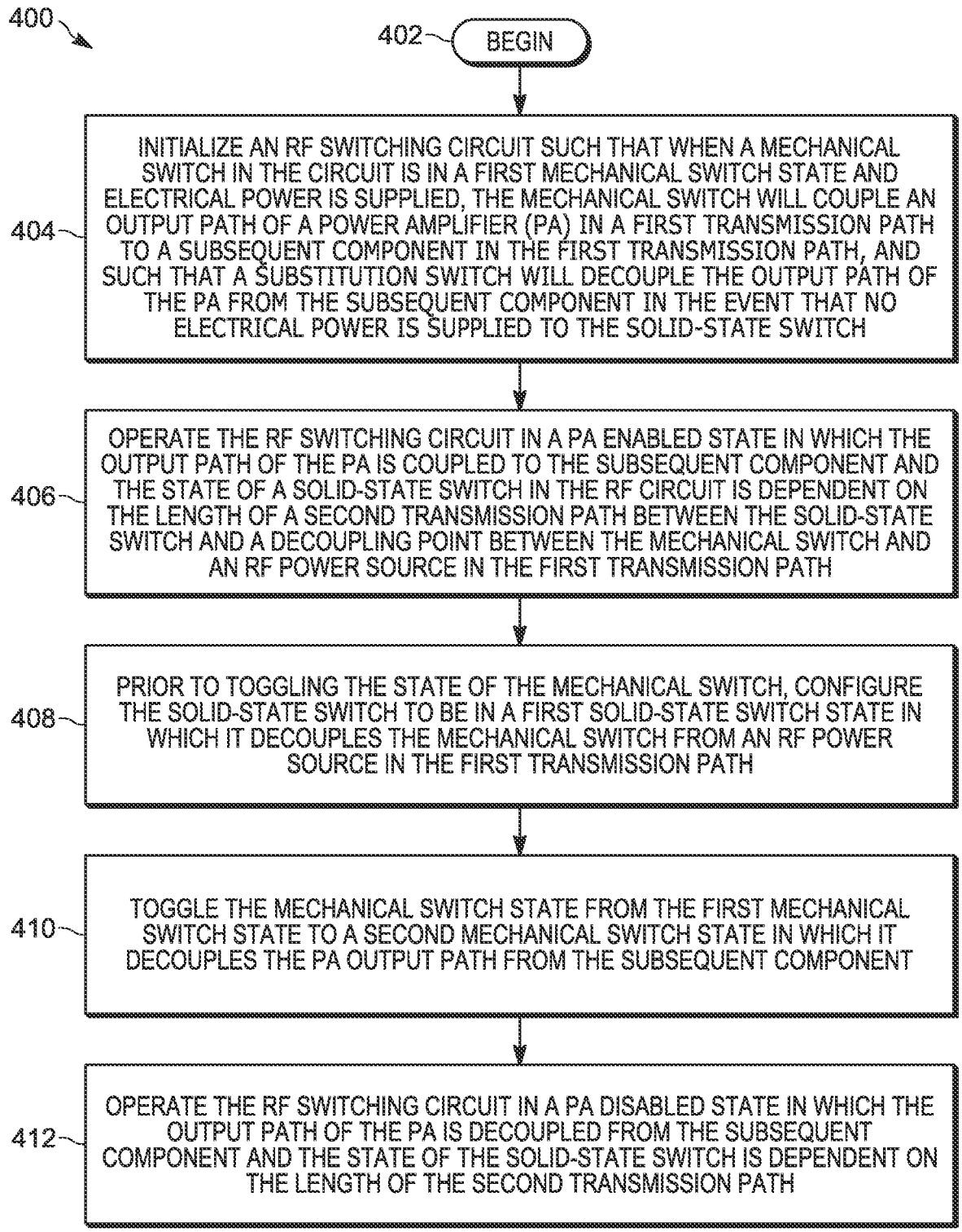
FIG. 4 is a flow diagram of selected elements of an example method for transitioning a radio frequency switching circuit including both a mechanical switch and a solid-state switch from a power amplifier enabled state to a power amplifier disabled state, in accordance with some embodiments.

Referring now to FIG. 4, there is provided a flow diagram of selected elements of an example method 400 for transitioning a radio frequency switching circuit including a mechanical switch and a solid-state switch from a power amplifier enabled state to a power amplifier disabled state, in accordance with some embodiments. While a particular order of operations is indicated in FIG. 4 for illustrative purposes, the timing and ordering of such operations may vary where appropriate without negating the purpose and advantages of the examples set forth in detail throughout the remainder of this disclosure. In various embodiments, some or all of the operations of method 400 may be controlled by a processing unit within a base station, a mobile station, or another device configured to transmit and, in some cases, receive baseband signals.

In this example embodiment, method 400 begins with block 402 and continues at block 404 with configuring a radio frequency (RF) switching circuit such that when a mechanical switch in the circuit is in a first mechanical switch state and electrical power is supplied, the mechanical switch will couple an output path of a power amplifier (PA) in a first transmission path to a subsequent component in the first transmission path, and such that a substitution switch will decouple the output path of the PA from the subsequent component in the event that no electrical power is supplied to the solid-state switch. For example, in some embodiments, the first transmission path may be a transmission path between the PA and an antenna. In other embodiments, the RF switching circuit might not include a substitution switch.

At 406, the method includes operating the RF switching circuit in a PA enabled state in which the output path of the PA is coupled to the subsequent component and the state of a solid-state switch in the RF circuit is dependent on the length of a second transmission path between the solid-state switch and a decoupling point between the mechanical switch and an RF power source in the first transmission path.

At 408, prior to toggling the state of the mechanical switch, the method includes configuring the solid-state switch to be in a first solid-state switch state in which it decouples the mechanical switch from an RF power source in the first transmission path.

At 410, method 400 includes toggling the mechanical switch from the first mechanical switch state to a second mechanical switch state in which it decouples the PA output path from the subsequent component.

At 412, the method includes operating the RF switching circuit in a PA disabled state in which the output path of the PA is decoupled from the subsequent component and the state of the solid-state switch is dependent on the length of the second transmission path.

In some embodiments, the mechanical switch may be a mechanical relay and the solid-state switch may be a PIN diode switch. In other embodiments, the solid-state switch may be or include another type of solid-state switch, such as a MOSFET, a bipolar junction transistor (BJT), or another type of transistor that can be operated in a switched fashion. In other embodiments, the mechanical switch may be or include another type of electromechanically actuated switch having one or more poles, rather than a mechanical relay.

In at least some embodiments, some or all of the operations of method 400 illustrated in FIG. 4 may be repeated one or more times during operation of the RF switching circuit.

Figure 5A:
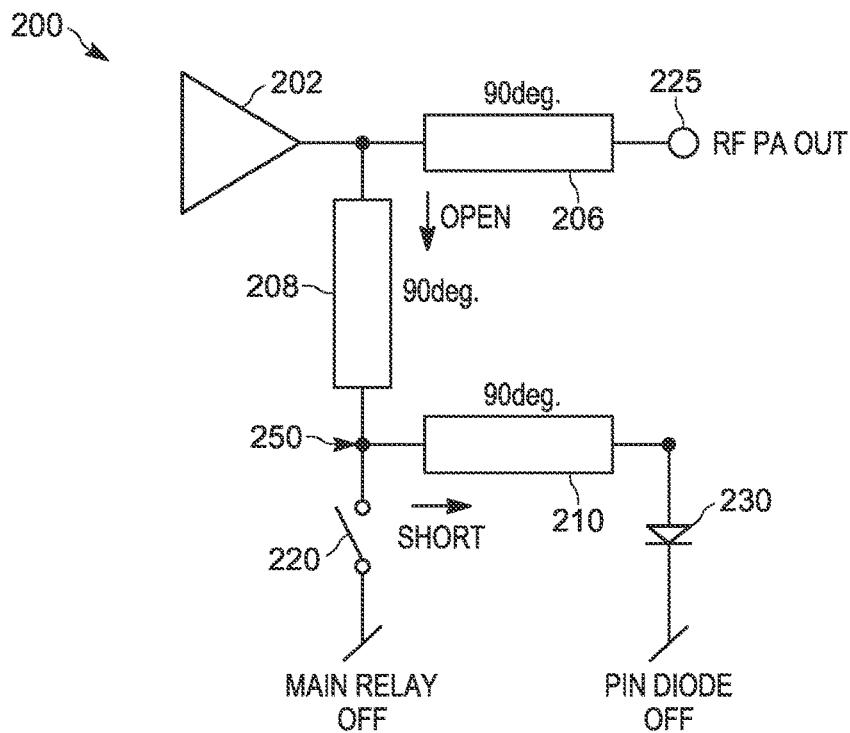
FIG. 5A is a circuit diagram illustrating selected elements of a radio frequency switching circuit including both a mechanical switch and a solid-state switch for hot-switching immunity during a transition from a power amplifier disabled state to a power amplifier enabled state, in accordance with the first embodiment.

FIG. 5A is a circuit diagram illustrating selected elements of radio frequency switching circuit 200 during a transition from a power amplifier disabled state to a power amplifier enabled state, in accordance with the first embodiment. In the illustrated embodiment, the solid-state switch 230 is a PIN diode switch that is OFF, and thereby open, during a transition from the PA disabled state to the PA disabled state resulting in a short circuit condition at the point at which the output path of the power amplifier 202 is coupled or decoupled from the mechanical switch, shown as decoupling point 250.

Figure 5B:
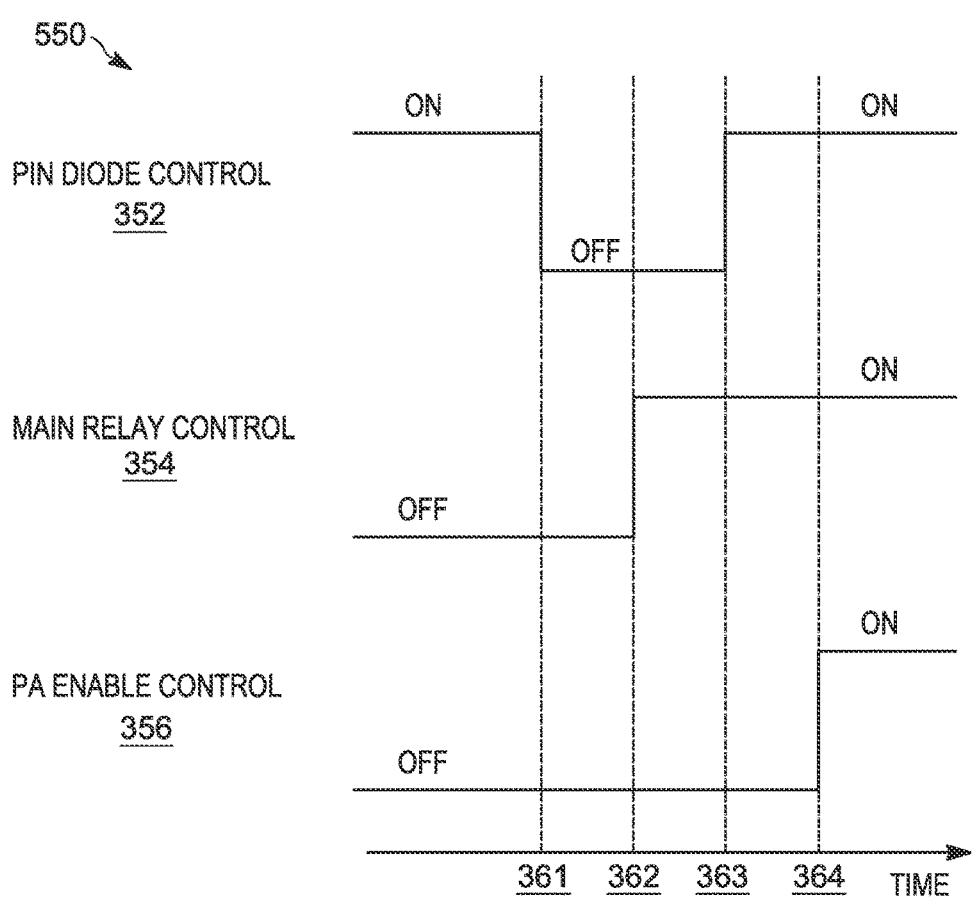
FIG. 5B is a timing diagram illustrating the respective states of a mechanical switch and a solid-state switch in a radio frequency switching circuit during a transition from a power amplifier disabled state to a power amplifier enabled state, in accordance with the first embodiment.

FIG. 5B is a timing diagram 550 illustrating the respective states of a mechanical switch and a solid-state switch in a radio frequency switching circuit during a transition from a power amplifier disabled state to a power amplifier enabled state, in accordance with the first embodiment. As illustrated in timing diagram 550, the sequencing of the switch states may be as follows: prior to toggling the state of a control signal for the mechanical switch, shown as main relay control 354, the state of a control signal for the solid-state switch, shown as PIN control 352, is toggled from a low impedance state (ON) to a high impedance state (OFF) at time 361.

In this example, while the solid-state switch is in the high impedance state, the main relay control 354 is toggled from the PA disabled state (OFF) to the PA enabled state (ON) at time 362. In this example, due to the topology of the RF switching circuit and the lengths of various transmission paths in the RF switching circuit, once the RF switching circuit is in the PA enabled state (OFF), the solid-state switch is returned to the low impedance state (ON) at time 363 and the PA enable control signal 356 is changed from the power amplifier disabled state (OFF) to the power amplifier enabled state (ON) at time 364, indicating that the state of the RF switching circuit has changed to the power amplifier enabled state. In other embodiments, due again to the topology of the RF switching circuit and the lengths of various transmission paths in the RF switching circuit, the solid-state switch might remain in the high impedance state (OFF) while the RF switching circuit is in the PA enabled state. In one example embodiment, the period during which the solid-state switch is in the high impedance state (OFF) may be on the order of 10 milliseconds or less, depending on the switching time of the mechanical switch and the solid-state switch.

Figure 6:
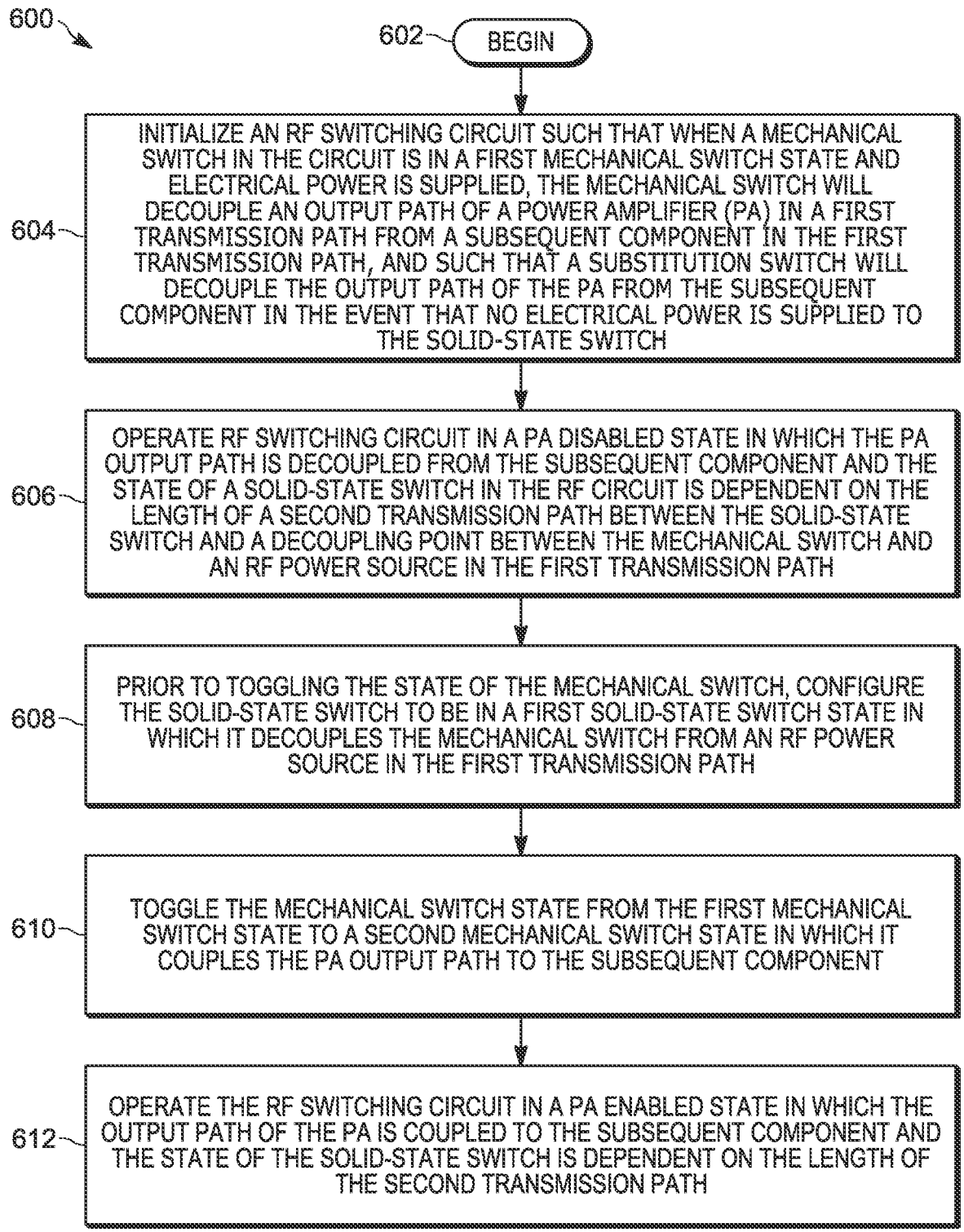
FIG. 6 is a flow diagram of selected elements of an example method for transitioning a radio frequency switching circuit including both a mechanical switch and a solid-state switch from a power amplifier disabled state to a power amplifier enabled state, in accordance with some embodiments.

Referring now to FIG. 6, there is provided a flow diagram of selected elements of an example method 600 for transitioning a radio frequency switching circuit including a mechanical switch and a solid-state switch from a power amplifier disabled state to a power amplifier enabled state, in accordance with some embodiments. While a particular order of operations is indicated in FIG. 6 for illustrative purposes, the timing and ordering of such operations may vary where appropriate without negating the purpose and advantages of the examples set forth in detail throughout the remainder of this disclosure. In various embodiments, some or all of the operations of method 600 may be controlled by a processing unit within a base station, a mobile station, or another device configured to transmit and, in some cases, receive baseband signals.

In this example embodiment, method 600 begins with block 602 and continues at block 604 with configuring a radio frequency (RF) switching circuit such that when a mechanical switch in the circuit is in a first mechanical switch state and electrical power is supplied, the mechanical switch will decouple an output path of a power amplifier (PA) in a first transmission path from a subsequent component in the first transmission path, and such that a substitution switch will decouple the output path of the PA from the subsequent component in the event that no electrical power is supplied to the solid-state switch. For example, in some embodiments, the first transmission path may be a transmission path between the PA and an antenna. In other embodiments, the RF switching circuit might not include a substitution switch.

At 606, the method includes operating the RF switching circuit in a PA disabled state in which the output path of the PA is decoupled from the subsequent component and the state of a solid-state switch in the RF circuit is dependent on the length of a second transmission path between the solid-state switch and a decoupling point between the mechanical switch and an RF power source in the first transmission path.

As described below in reference to FIGS. 12A and 12B, while electrical power is supplied to the solid-state switch, the state of the substitution switch may have no effect on the operation of the RF switching circuit.

At 608, prior to toggling the state of the mechanical switch, method 600 includes configuring the solid-state switch to be in a first solid-state switch state in which it decouples the mechanical switch from an RF power source in the first transmission path.

At 610, the method includes toggling the mechanical switch state from the first mechanical switch state to a second mechanical switch state in which it couples the PA output path to the subsequent component.

At 612, the method includes operating the RF switching circuit in a PA enabled state in which the output path of the PA is coupled to the subsequent component and the state of the solid-state switch is dependent on the length of the second transmission path.

In some embodiments, the mechanical switch may be a mechanical relay and the solid-state switch may be a PIN diode switch. In other embodiments, the solid-state switch may be or include another type of solid-state switch, such as a MOSFET, a bipolar junction transistor (BJT), or another type of transistor that can be operated in a switched fashion. In other embodiments, the mechanical switch may be or include another type of electromechanically actuated switch having one or more poles, rather than a mechanical relay.

In at least some embodiments, some or all of the operations of method 600 illustrated in FIG. 6 may be repeated one or more times during operation of the RF switching circuit.

While a particular embodiment is illustrated in FIGS. 2A-2B, 3A, and 5A and described in detail above, the techniques described herein for using an RF switching circuit having both a mechanical switch and a solid-state switch to provide hot-switching immunity and other advantages may be implemented using RF switching circuits with topologies other than those illustrated in FIGS. 2A-2B, 3A, and 5A. For example, in various embodiments, the mechanical switch and the solid-state switch may be positioned in series or in parallel with each other or with other elements of the RF switching circuit. Similarly, the particular states of the mechanical switch, the solid-state switch and the overall state of the RF switching circuit may be dependent on the lengths of various transmission paths between these and other elements of the RF switching circuit. In some cases, with different topologies, there may be certain performance trade-offs such as differences in insertion loss, intermodulation distortion, component cost, or power handling capability, for example. RF switching circuits with other topologies are illustrated in FIGS. 7A-7B, 8A-8D, 9A-9B, 10A-10B, 11A-11B, and 12A-12C, in accordance with different embodiments.

Figure 7A:
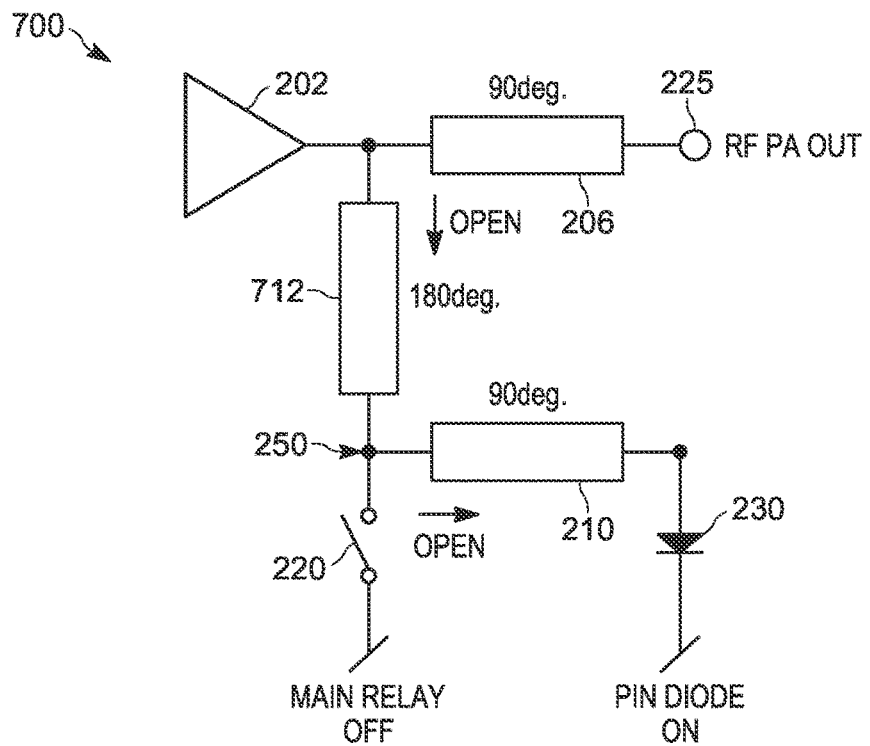
FIG. 7A is a circuit diagram illustrating selected elements of a radio frequency switching circuit including both a mechanical switch and a solid-state switch for hot-switching immunity and operating in a power amplifier enabled state, in accordance with a second embodiment.

FIG. 7A is a circuit diagram illustrating selected elements of a radio frequency switching circuit 700 including a mechanical switch and a solid-state switch for hot-switching immunity and operating in a power amplifier enabled state, in accordance with a second embodiment. In this PA enabled state, PA 202 delivers power to RF PA OUT 225 and any subsequent component(s) in the transmission path. In the illustrated embodiment, the mechanical switch 220 is a mechanical relay that serves as the primary switching control for RF switching circuit 200 and the solid-state switch 230 is a PIN diode switch. In other embodiments, the solid-state switch 230 may be or include another type of solid-state switch, such as a MOSFET, a bipolar junction transistor (BJT), or another type of transistor that can be operated in a switched fashion. In other embodiments, the mechanical switch 220 may be or include another type of electromechanically actuated switch having one or more poles, rather than a mechanical relay.

The RF switching circuit 700 couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state. The solid-state switch 230 is configured to impart a low impedance at a pin of the mechanical switch 220, shown as decoupling point 250, to operatively decouple the mechanical switch 220 from an RF power source when in a first solid-state switch state and to impart a higher impedance at the pin of the mechanical switch when in a second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 206 represents an ideal 90-degree transmission line in the first transmission path between power amplifier 202 and the output of RF switching circuit 200, shown as RF PA OUT 225. Transmission cable 714 represents an ideal 180-degree transmission line in a second transmission path between power amplifier 202 and mechanical switch 220, and transmission cable 210 represents an ideal 90-degree transmission line in a third transmission path between power amplifier 202 and solid-state switch 230. In practice, a 180-degree transmission path may include a cable that is less than a half wave length with the remaining length being attributed to various components along the path. In addition, the effect of a 180-degree path may be realized by a transmission path including any even number of 90-degree segments or by a transmission path whose length is an even multiple of 90 degrees.

In the illustrated embodiment, the solid-state switch 230 is configured to be in the second solid-state switch state while the mechanical switch 220 is in the first mechanical switch state and while the mechanical switch 220 is in the second mechanical switch state. In the illustrated embodiment, the mechanical switch 220 is in an open position when in the first mechanical switch state and is in a closed position when in the second mechanical switch state. In the illustrated embodiment, the solid-state switch 230 is in an open circuit state when in the first solid-state switch state and is in a closed circuit state when in the second solid-state switch state. In the illustrated embodiment, the mechanical switch 220 is positioned in the second transmission path parallel to the first transmission path and the solid-state switch 230 is positioned in the third transmission path parallel to the second transmission path.

Figure 7B:
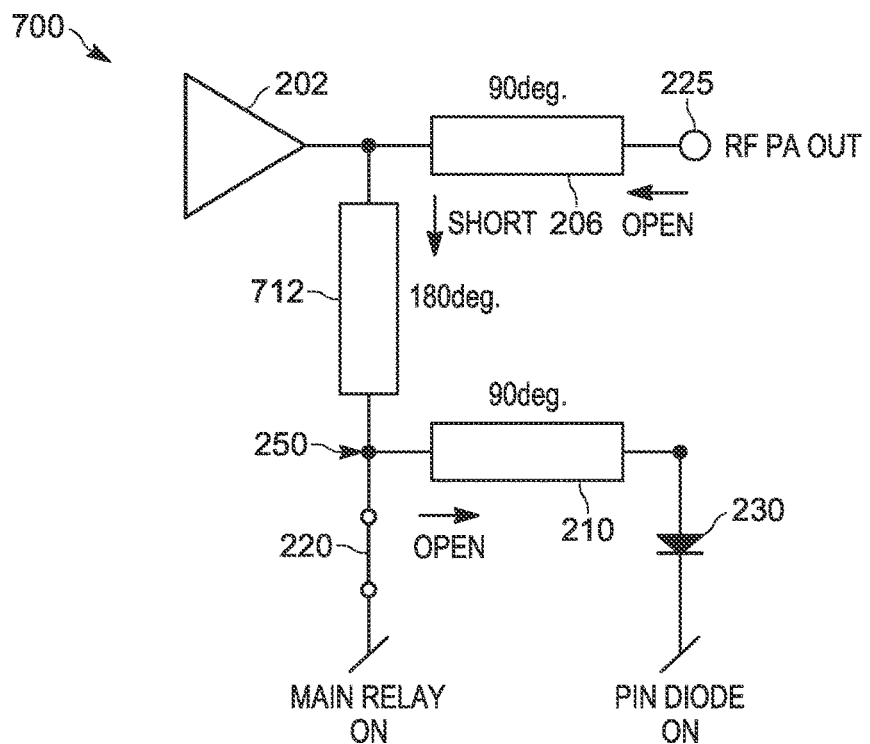
FIG. 7B is a circuit diagram illustrating selected elements of a radio frequency switching circuit including both a mechanical switch and a solid-state switch for hot-switching immunity and operating in a power amplifier disabled state, in accordance with the second embodiment.

FIG. 7B is a circuit diagram illustrating selected elements of radio frequency switching circuit 700 while operating in a power amplifier disabled state, in accordance with the second embodiment. In this PA disabled state, the power amplifier is decoupled from PA RF OUT 225.

FIGS. 8A-8D are circuit diagrams each illustrating selected elements of a respective radio frequency switching circuit including a mechanical switch and a solid-state switch for hot-switching immunity and operating in a power amplifier enabled state, in accordance with third, fourth, fifth, and sixth embodiments. In this PA enabled state, PA 202 delivers power to RF PA OUT 225 and any subsequent component(s) in the transmission path. In the illustrated embodiments, the mechanical switch 220 is a mechanical relay that serves as the primary switching control for the RF switching circuit and the solid-state switch 230 is a PIN diode switch. In other embodiments, the solid-state switch 230 may be or include another type of solid-state switch, such as a MOSFET, a bipolar junction transistor (BJT), or another type of transistor that can be operated in a switched fashion. In other embodiments, the mechanical switch 220 may be or include another type of electromechanically actuated switch having one or more poles, rather than a mechanical relay.

Figure 8A:
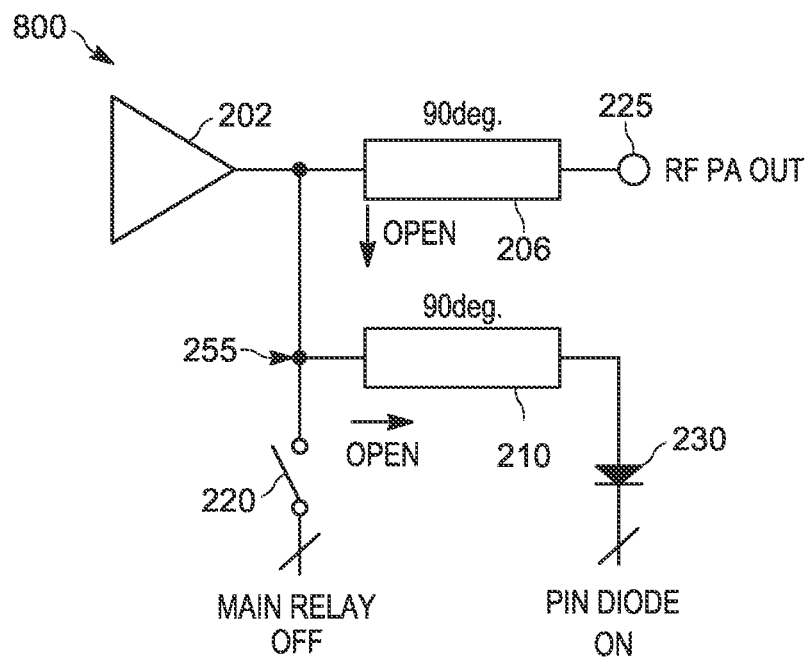
FIGS. 8A-8D are circuit diagrams each illustrating selected elements of a respective radio frequency switching circuit including both a mechanical switch and a solid-state switch for hot-switching immunity and operating in a power amplifier enabled state, in accordance with third, fourth, fifth, and sixth embodiments.

More specifically, RF switching circuit 800 shown in FIG. 8A couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state. The solid-state switch 230 is configured to impart a low impedance at a pin of the mechanical switch 220, shown as decoupling point 255, to operatively decouple the mechanical switch 220 from an RF power source when in a first solid-state switch state and to impart a higher impedance at the pin of the mechanical switch when in a second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 206 represents an ideal 90-degree transmission line in the first transmission path between power amplifier 202 and the output of RF switching circuit 200, shown as RF PA OUT 225. Transmission cable 210 represents an ideal 90-degree transmission line in a second transmission path between power amplifier 202 and solid-state switch 230. In the illustrated embodiment, the mechanical switch 220 is in an open position when in the first mechanical switch state and is in a closed position when in the second mechanical switch state. In the illustrated embodiment, the solid-state switch 230 is in an open circuit state when in the first solid-state switch state and is in a closed circuit state when in the second solid-state switch state. In the illustrated embodiment, the mechanical switch 220 is positioned in a second transmission path parallel to the first transmission path and the solid-state switch 230 is positioned in a third transmission path parallel to the second transmission path.

Figure 8B:
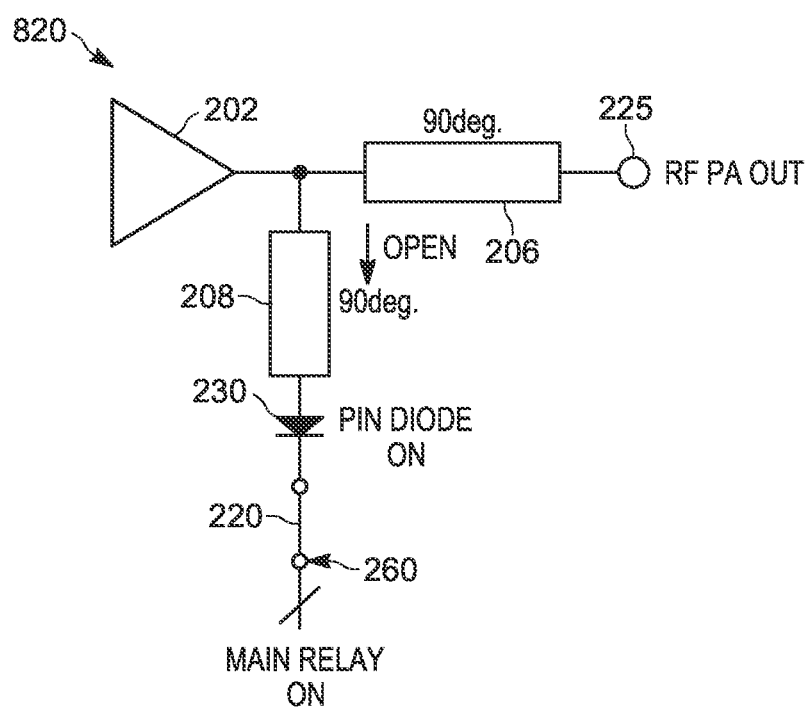

In another example, RF switching circuit 820 shown in FIG. 8B couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state. The solid-state switch 230 is configured to operatively decouple the mechanical switch 220 from an RF power source at a pin of the mechanical switch 220, shown as decoupling point 260, when in a first solid-state switch state but not when in a second solid-state switch state. In the illustrated embodiment, rather than imparting a low or high impedance at the mechanical switch 220, the solid-state switch directly attenuates the RF power at the decoupling point 260 when in the first solid-state switch state but does not attenuate the RF power when in the second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 206 represents an ideal 90-degree transmission line in the first transmission path between power amplifier 202 and the output of RF switching circuit 200, shown as RF PA OUT 225. Transmission cable 208 represents an ideal 90-degree transmission line in a second transmission path between power amplifier 202 and mechanical switch 220. In this embodiment, solid-state switch 230 is positioned in series with mechanical switch 220 in the second transmission path. In the illustrated embodiment, the mechanical switch 220 is in a closed position when in the first mechanical switch state and is in an open position when in the second mechanical switch state. In the illustrated embodiment, the solid-state switch 230 is in an open circuit state when in the first solid-state switch state and is in a closed circuit state when in the second solid-state switch state.

Figure 8C:
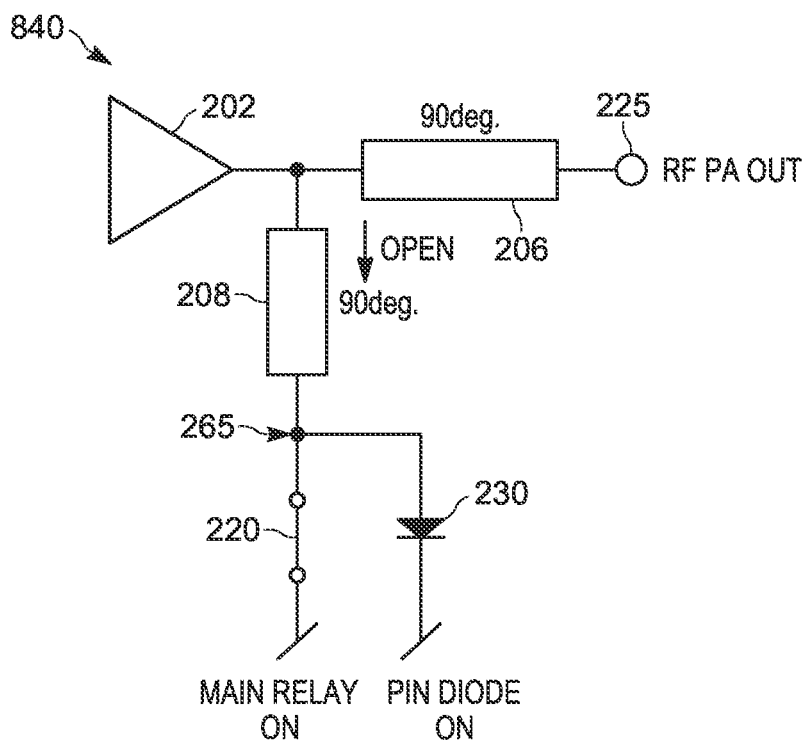

In another example, RF switching circuit 840 shown in FIG. 8C couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state. The solid-state switch 230 is configured to impart a low impedance at a pin of the mechanical switch 220, shown as decoupling point 265, to operatively decouple the mechanical switch 220 from an RF power source when in a first solid-state switch state and to impart a higher impedance at the pin of the mechanical switch when in a second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 206 represents an ideal 90-degree transmission line in the first transmission path between power amplifier 202 and the output of RF switching circuit 200, shown as RF PA OUT 225. Transmission cable 208 represents an ideal 90-degree transmission line in a second transmission path between power amplifier 202 and mechanical switch 220. In this embodiment, solid-state switch 230 is positioned in parallel with mechanical switch 220. In the illustrated embodiment, the mechanical switch 220 is in a closed position when in the first mechanical switch state and is in an open position when in the second mechanical switch state. In the illustrated embodiment, the solid-state switch 230 is in an open circuit state when in the first solid-state switch state and is in a closed circuit state when in the second solid-state switch state. In the illustrated embodiment, the mechanical switch 220 is positioned in a second transmission path parallel to the first transmission path and the solid-state switch 230 is positioned in a third transmission path parallel to the second transmission path.

Figure 8D:
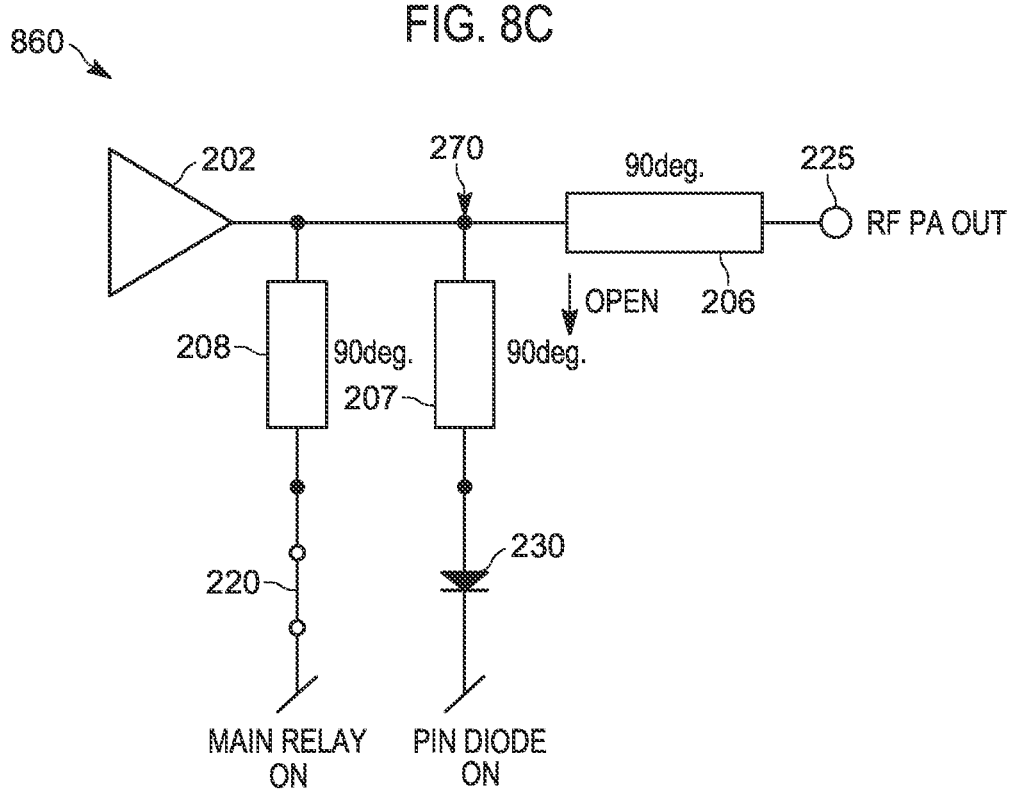

In yet another example, RF switching circuit 860 shown in FIG. 8D couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state.

In the illustrated example, the solid-state switch 230 is configured to impart a low impedance between the mechanical switch 220 and the RF power source of the first transmission path, shown as decoupling point 270, when in a first solid-state switch state and to impart a higher impedance at the decoupling point 270 when in a second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 208 represents an ideal 90-degree transmission line in a second transmission path between power amplifier 202 and mechanical switch 220 and transmission cable 207 represents an ideal 90-degree transmission line in a third transmission path parallel to the second transmission path between power amplifier 202 and solid-state switch 230. In the illustrated embodiment, the mechanical switch 220 is in a closed position when in the first mechanical switch state and is in an open position when in the second mechanical switch state. In the illustrated embodiment, the solid-state switch 230 is in an open circuit state when in the first solid-state switch state and is in a closed circuit state when in the second solid-state switch state.

Figure 9A:
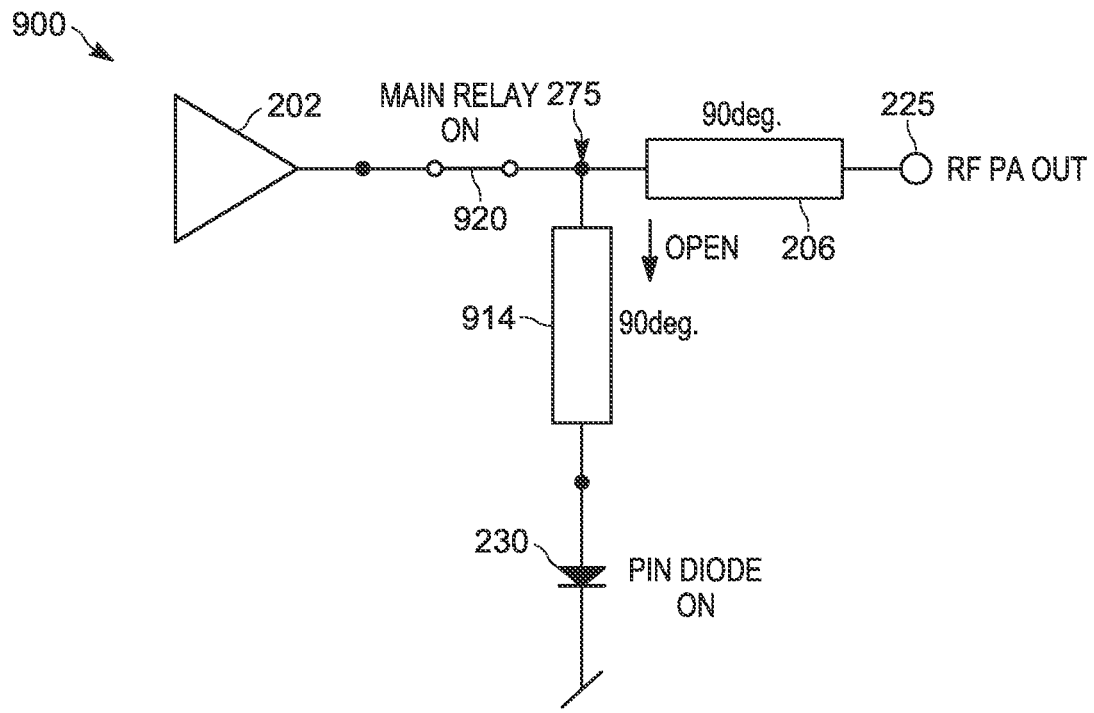
FIGS. 9A and 9B are circuit diagrams illustrating selected elements of a radio frequency switching circuit including a mechanical switch in series with a power amplifier and a solid-state switch operating in a power amplifier enabled state and in a power amplifier disabled state, respectively, in accordance with a seventh embodiment.
Figure 9B:
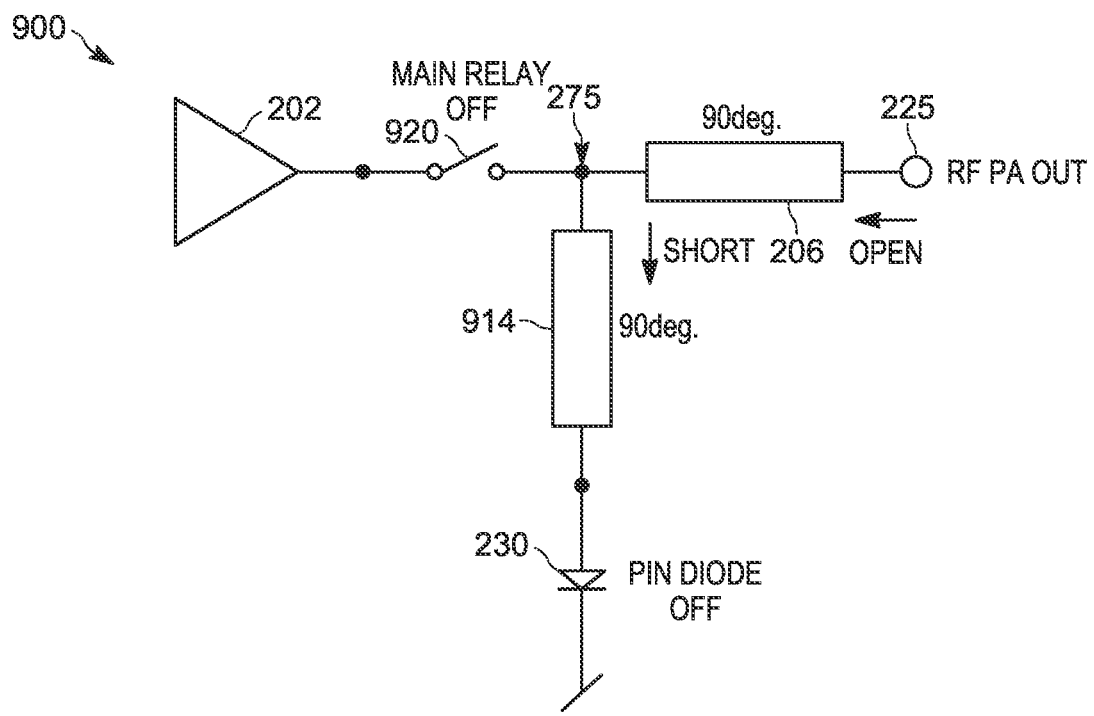

FIGS. 9A and 9B are circuit diagrams illustrating selected elements of a radio frequency switching circuit 900 including both a mechanical switch and a solid-state switch operating in a power amplifier enabled state and in a power amplifier disabled state, respectively, in accordance with a seventh embodiment. In the PA enabled state, PA 202 delivers power to RF PA OUT 225 and any subsequent component(s) in the transmission path. In the PA disabled state, PA 202 is decoupled from PA RF OUT 225.

In the illustrated embodiment, the mechanical switch 220 is a mechanical relay that serves as the primary switching control for the RF switching circuit and the solid-state switch 230 is a PIN diode switch. In other embodiments, the solid-state switch 230 may be or include another type of solid-state switch, such as a MOSFET, a bipolar junction transistor (BJT), or another type of transistor that can be operated in a switched fashion. In other embodiments, the mechanical switch 220 may be or include another type of electromechanically actuated switch having one or more poles, rather than a mechanical relay.

The RF switching circuit 900 couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state. The solid-state switch 230 is configured to impart a low impedance at a pin of the mechanical switch 220, shown as decoupling point 275, to operatively decouple the mechanical switch 220 from an RF power source when in a first solid-state switch state and to impart a higher impedance at the pin of the mechanical switch when in a second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 206 represents an ideal 90-degree transmission line in the first transmission path between power amplifier 202 and the output of RF switching circuit 200, shown as RF PA OUT 225. Transmission cable 914 represents an ideal 90-degree transmission line in a second transmission path between power amplifier 202 and solid-state switch 230. In the illustrated embodiment, the mechanical switch 230 is positioned in series with the output path of the power amplifier 202 in the first transmission path and the solid-state switch 230 is positioned in a second transmission path parallel to the first transmission path. In the illustrated embodiment, the solid-state switch 230 is configured to be in the first solid-state switch state while the mechanical switch 220 is in the second mechanical switch state and the solid-state switch 230 is configured to be in the second solid-state switch state while the mechanical switch 220 is in the first mechanical switch state. In the illustrated embodiment, the mechanical switch 220 is in a closed position when in the first mechanical switch state and is in an open position when in the second mechanical switch state. In the illustrated embodiment, the solid-state switch 230 is in an open circuit state when in the first solid-state switch state and is in a closed circuit state when in the second solid-state switch state.

Figure 10A:
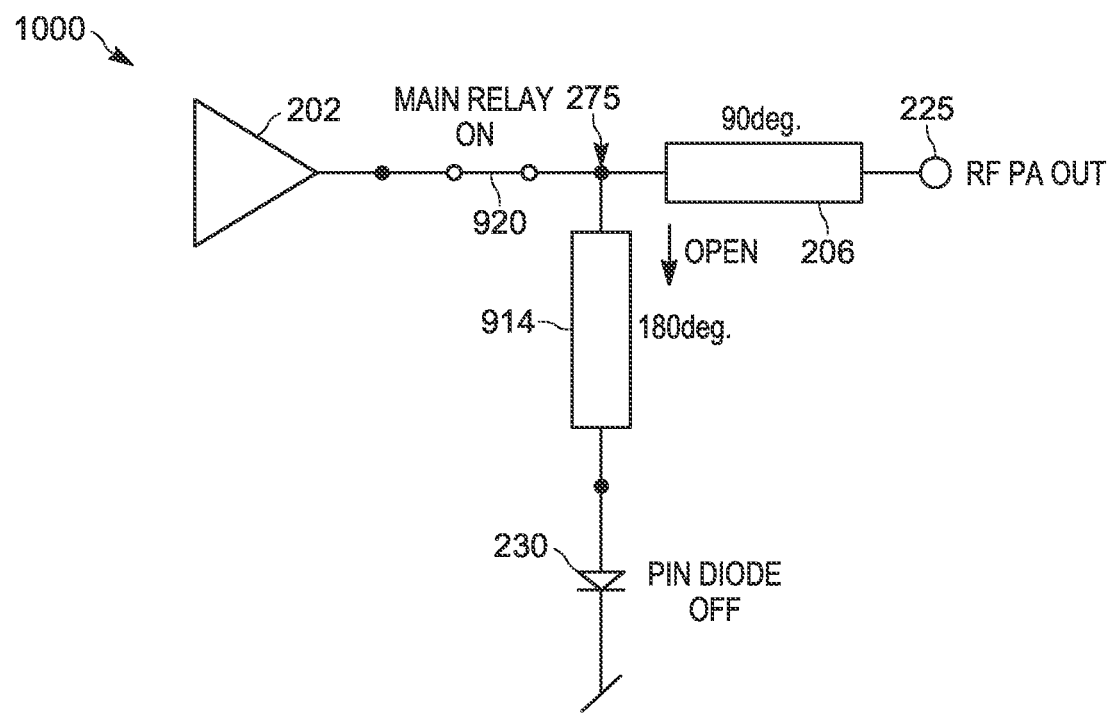
FIGS. 10A and 10B are circuit diagrams illustrating selected elements of a radio frequency switching circuit including a mechanical switch in series with a power amplifier and a solid-state switch operating in a power amplifier enabled state and in a power amplifier disabled state, respectively, in accordance with an eighth embodiment.
Figure 10B:
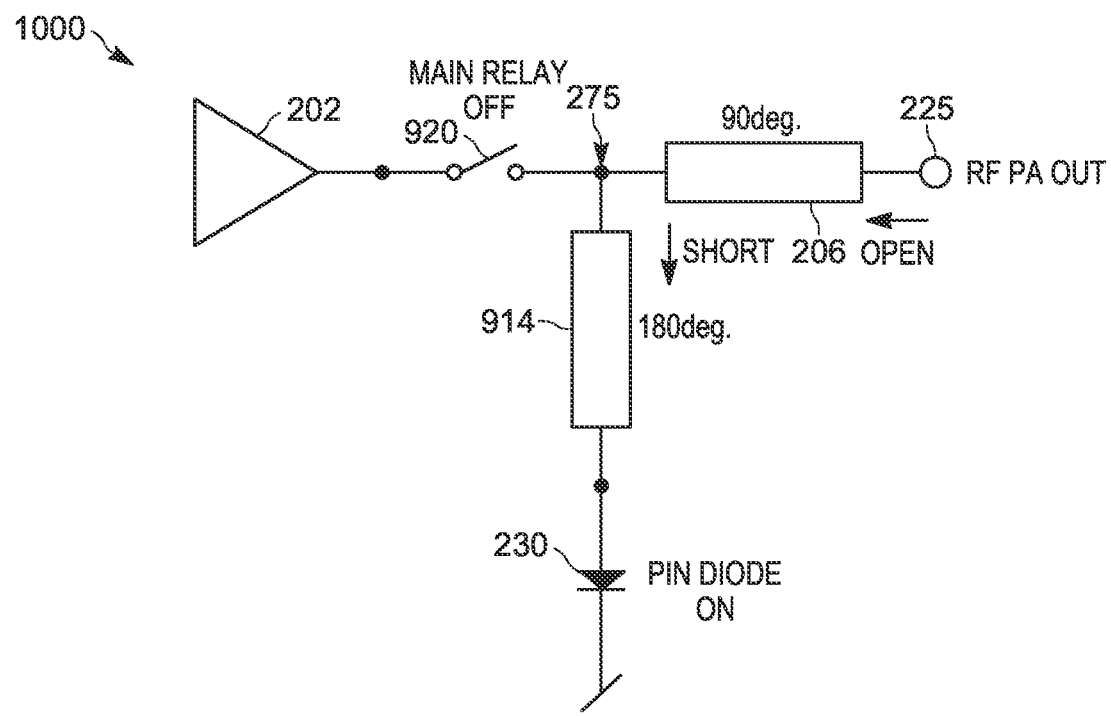

FIGS. 10A and 10B are circuit diagrams illustrating selected elements of a radio frequency switching circuit including both a mechanical switch and a solid-state switch operating in a power amplifier enabled state and in a power amplifier disabled state, respectively, in accordance with an eighth embodiment. In the PA enabled state, PA 202 delivers power to RF PA OUT 225 and any subsequent component(s) in the transmission path. In the PA disabled state, PA 202 is decoupled from PA RF OUT 225.

In the illustrated embodiment, the mechanical switch 220 is a mechanical relay that serves as the primary switching control for the RF switching circuit and the solid-state switch 230 is a PIN diode switch. In other embodiments, the solid-state switch 230 may be or include another type of solid-state switch, such as a MOSFET, a bipolar junction transistor (BJT), or another type of transistor that can be operated in a switched fashion. In other embodiments, the mechanical switch 220 may be or include another type of electromechanically actuated switch having one or more poles, rather than a mechanical relay.

The RF switching circuit 1000 couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state. The solid-state switch 230 is configured to impart a low impedance at a pin of the mechanical switch 220, shown as decoupling point 275, to operatively decouple the mechanical switch 220 from an RF power source when in a first solid-state switch state and to impart a higher impedance at the pin of the mechanical switch when in a second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 206 represents an ideal 90-degree transmission line in the first transmission path between power amplifier 202 and the output of RF switching circuit 200, shown as RF PA OUT 225. Transmission cable 914 represents an ideal 180-degree transmission line in a second transmission path between power amplifier 202 and solid-state switch 230. In the illustrated embodiment, the mechanical switch 220 is positioned in series with the output path of the power amplifier 202 in the first transmission path and the solid-state switch 230 is positioned in a second transmission path parallel to the first transmission path. In the illustrated embodiment, the solid-state switch 230 is configured to be in the first solid-state switch state while the mechanical switch 220 is in the first mechanical switch state and the solid-state switch 230 is configured to be in the second solid-state switch state while the mechanical switch 220 is in the second mechanical switch state. In the illustrated embodiment, the mechanical switch 220 is in a closed position when in the first mechanical switch state and is in an open position when in the second mechanical switch state. In the illustrated embodiment, the solid-state switch 230 is in a closed circuit state when in the first solid-state switch state and is in an open circuit state when in the second solid-state switch state.

In various embodiments, an RF switching circuit that includes both a mechanical switch and a solid-state switch may be located in whole or in part within an RF PA module that includes the RF switching circuit and the power amplifier whose output path is coupled or decoupled to a subsequent component in a transmission path based on the state of the RF switching circuit. The RF PA module may be implemented as a standalone hardware component in the system integrating the functionality of a power amplifier and a corresponding RF switching circuit. In other embodiments, the RF switching circuit may be located entirely outside of the RF PA module between the power amplifier and an antenna port of a base station, for example. The location of the RF switching circuit and the length of the cables coupling the output of the RF switching circuit to another component may affect the respective states of the mechanical switch, the solid-state switch, or both, when the RF switching circuit is operating in the PA enabled state, when the RF switching circuit is operating in the PA disabled state, and when the RF switching circuit is transitioning between the PA enabled state and the PA disabled state.

Figure 11A:
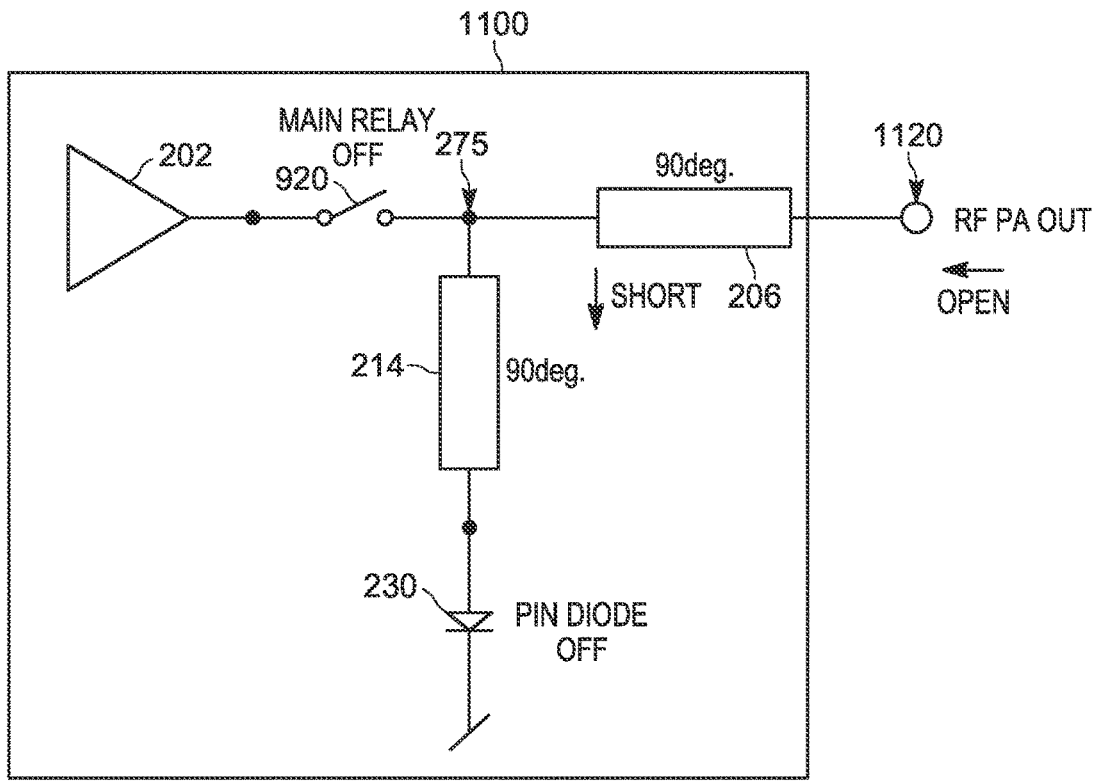
FIGS. 11A and 11B are circuit diagrams illustrating respective placements of a radio frequency switching circuit including both a mechanical switch and a solid-state switch for hot-switching immunity.
Figure 11B:
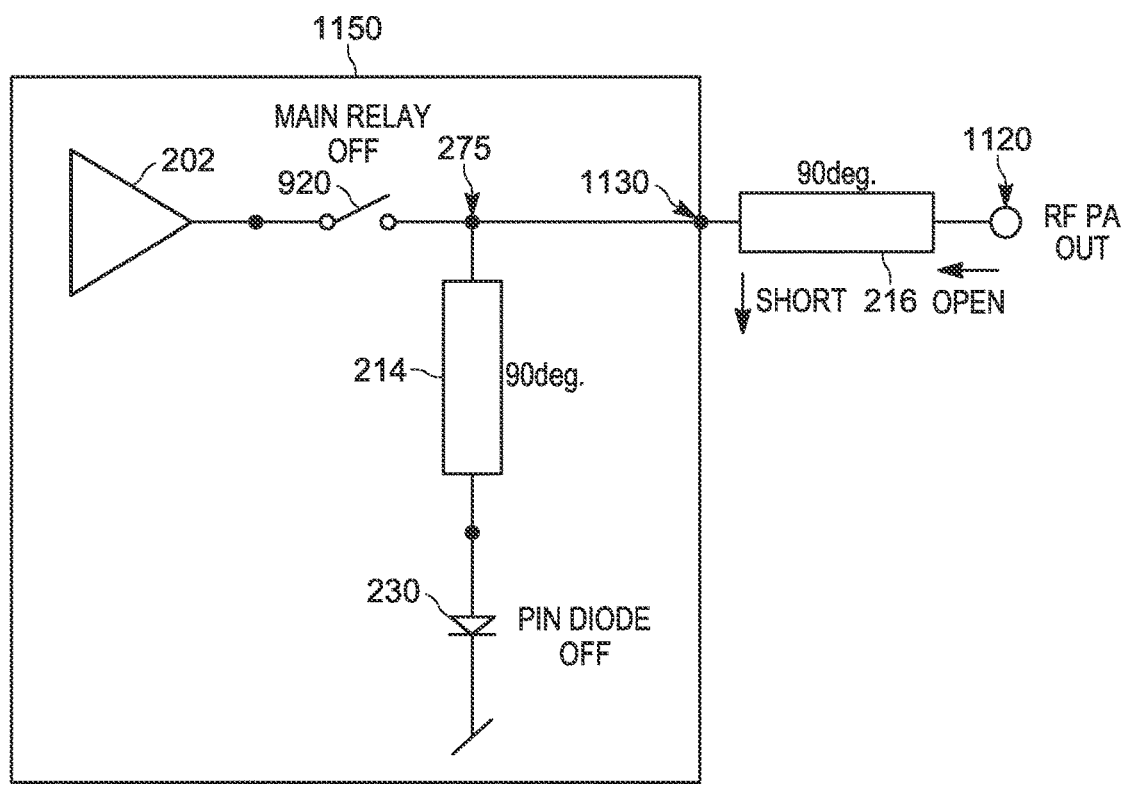

FIGS. 11A and 11B are circuit diagrams illustrating respective placements of a radio frequency switching circuit including both a mechanical switch and a solid-state switch for hot-switching immunity. For example, in FIG. 11A, the radio frequency switching circuit is located entirely with an RF PA module 1100 that includes power amplifier 202 and an RF switching circuit similar to the RF switching circuit illustrated in FIG. 10A. In this example, there would be a high impedance at RF PA output 1120 when the RF switching circuit is in the PA disabled state.

By contrast, in FIG. 11B, a portion of the RF switching circuit shown in FIG. 10A is located outside of RF PA module 1150. In this example, there would be a low impedance at output 1130 of RF PA module 1150 when the RF switching circuit is in the PA disabled state. However, after an additional 90-degree transmission line, there would be a high impedance at RF PA output 1120 when the RF switching circuit is in the PA disabled state. At RF PA output 1120, after this external cable, the high impedance is realized in the RF network, yielding the desired result of open switch state when the RF switching circuit is in the PA disabled state. As illustrated in this example, a desired impedance at the output of the RF PA module or at the input of a subsequent component in the transmission path that includes the RF PA module, may be achieved by the addition of one or more quarter-wave (90-degree) lengths of cabling, as appropriate.

In some applications of the RF switching circuits described herein, if an amplifier fails due to a failing power supply, faulty wiring, or another failure mode in the amplifier, the RF switching circuit may be put into a state in which power from the rest of the system is consumed even though the amplifier is disabled. In some embodiments, to resolve this issue, the RF switching circuits described herein may include a substitution switch configured to decouple the output path of a PA from a subsequent component in its transmission path in the event that no electrical power is supplied to the solid-state switch. The purpose of the substitution switch is to impart a low impedance at the solid-state switch connection point in the event that no electrical power is supplied to the solid-state switch, but also in the event that, for any other reason, the solid-state switch cannot be relied upon to decouple the output path of the PA in a failure mode. While electrical power is supplied to the solid-state switch, the state of the substitution switch may have no effect on the operation of the RF switching circuit. In various embodiments, the substitution switch may be or include a mechanical switch, such as a mechanical relay or another type of electromechanically actuated switch having one or more poles.

In some embodiments, the substitution switch may be controlled entirely by the power supply such that if, for any reason, the power supply ceases supplying power to the RF switching circuit or, more specifically, to the solid-state switch, the substitution switch will be shorted, putting the RF switching circuit into a state that is similar to the PA disabled state.

As is the case with the mechanical switches that serve as the primary switching control for the RF switching circuit, the configuration of the substitution switch in particular states may be reversible by adding an odd number of quarter-wave transmission line segments or a segment whose length is an odd multiple of 90 degrees.

Figure 12A:
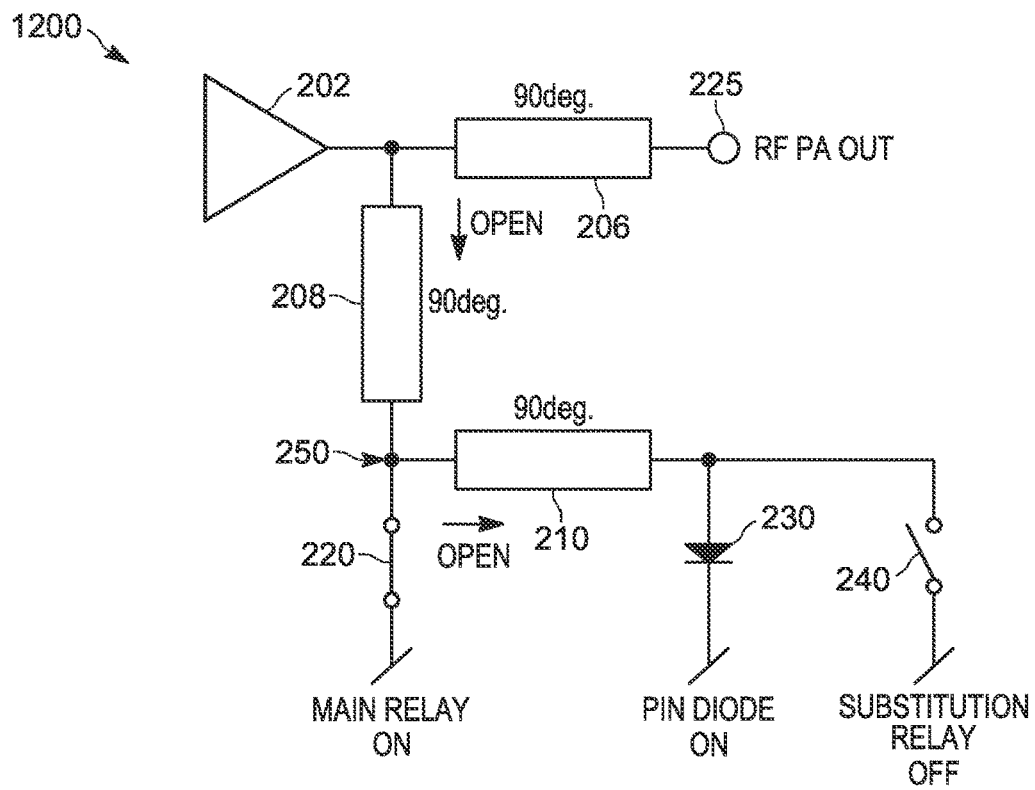
FIGS. 12A and 12B are circuit diagrams illustrating selected elements of a radio frequency switching circuit including a mechanical switch, a solid-state switch, and a substitution switch operating in a power amplifier enabled state and in a power amplifier disabled state, respectively, in accordance with a ninth embodiment.
Figure 12B:
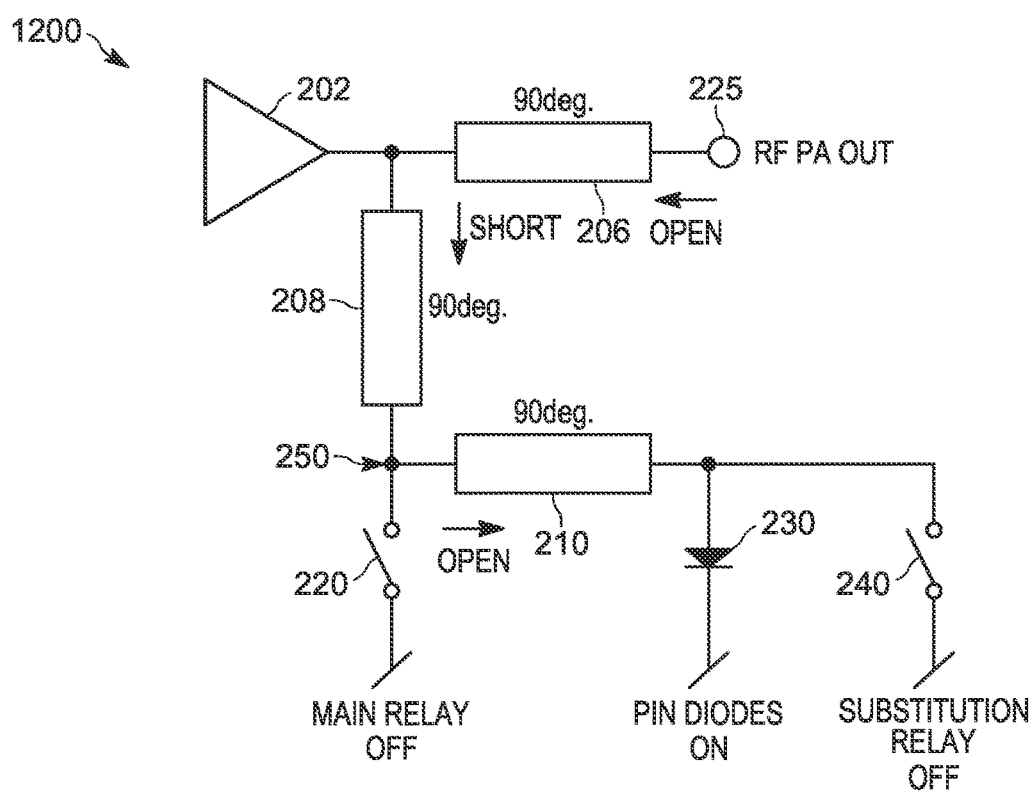

FIGS. 12A and 12B are circuit diagrams illustrating selected elements of a radio frequency switching circuit 1200 including a mechanical switch, a solid-state switch, and a substitution switch operating in a power amplifier enabled state and in a power amplifier disabled state, respectively, in accordance with a ninth embodiment. In the PA enabled state, PA 202 delivers power to RF PA OUT 225 and any subsequent component(s) in the transmission path. In the PA disabled state, PA 202 is decoupled from PA RF OUT 225 and any subsequent component(s).

In the illustrated embodiment, the mechanical switch 220 is a mechanical relay that serves as the primary switching control for the RF switching circuit and the solid-state switch 230 is a PIN diode switch. In other embodiments, the solid-state switch 230 may be or include another type of solid-state switch, such as a MOSFET, a bipolar junction transistor (BJT), or another type of transistor that can be operated in a switched fashion. In other embodiments, the mechanical switch 220 may be or include another type of electromechanically actuated switch having one or more poles, rather than a mechanical relay. RF switching circuit 1200 has a topology similar to the topology of RF switching circuit 200 illustrated in FIGS. 2A-2B, 3A, and 5A, with the addition of a substitution switch 240 that is configured to decouple the output path of the power amplifier 202 from the subsequent component while no electrical power is supplied to the solid-state switch 230. Note that, in other embodiments, a substitution switch may be added to an RF switching circuit with both a mechanical switch and a solid-state switch and having a topology other than the topology of RF switching circuit 200 to decouple the output path of the power amplifier from the subsequent component while no electrical power is supplied to the solid-state switch.

The RF switching circuit 1200 couples power amplifier 202 to a subsequent component in a transmission path that includes power amplifier 202 when operating in the power amplifier enabled state and decouples power amplifier 202 from the subsequent component when operating in the power amplifier disabled state. For example, mechanical switch 220 is configured to couple the output path of power amplifier 202 in a first transmission path to the subsequent component when in a first mechanical switch state and to decouple the output path of the power amplifier from the subsequent component when in a second mechanical switch state. The solid-state switch 230 is configured to impart a low impedance at a pin of the mechanical switch 220, shown as decoupling point 250, to operatively decouple the mechanical switch 220 from an RF power source when in a first solid-state switch state and to impart a higher impedance at the pin of the mechanical switch when in a second solid-state switch state. The solid-state switch 230 is configured to be in the first solid-state switch state during transitions of the mechanical switch 220 from the first mechanical switch state to the second mechanical switch state and from the second mechanical switch state to the first mechanical switch state.

In the illustrated embodiment, transmission cable 206 represents an ideal 90-degree transmission line in the first transmission path between power amplifier 202 and the output of RF switching circuit 200, shown as RF PA OUT 225. Transmission cable 208 represents an ideal 90-degree transmission line in a second transmission path between power amplifier 202 and mechanical switch 220, and transmission cable 210 represents an ideal 90-degree transmission line in a third transmission path between power amplifier 202 and solid-state switch 230. In the illustrated embodiment, the solid-state switch 230 is positioned in a second transmission path parallel to the first transmission path. The RF switching circuit 1200 also includes a substitution switch 240 in a third transmission path parallel to the second transmission path that is configured to decouple the output path of the power amplifier 202 from the subsequent component while no electrical power is supplied to the solid-state switch 230. As illustrated in FIGS. 12A and 12B, the substitution switch 240 is an additional mechanical switch, and more specifically an additional mechanical relay, whose position when configured to decouple the output path of the power amplifier 202 from the subsequent component is dependent on the length of the third transmission path. In other embodiments, the substitution switch may be or include another type of electromechanically actuated switch having one or more poles, rather than a mechanical relay. In at least some embodiments, while electrical power is supplied to the solid-state switch 230, the state of the substitution switch 240 may have no effect on the operation of the RF switching circuit and may not be dependent on the state of the RF switching circuit. For example, the substitution switch 240 may remain in an OFF state while the RF switching circuit is in the PA enabled state, while the RF switching circuit is in the PA disabled state and during transitions of the RF switching circuit from the PA enabled state to the PA disabled state as long as electrical power is supplied to the solid-state switch 230.

In the illustrated embodiment, the solid-state switch 230 is configured to be in the second solid-state switch state while the mechanical switch 220 is in the first mechanical switch state and while the mechanical switch is in the second mechanical switch state. In the illustrated embodiment, the mechanical switch 220 is in a closed position when in the first mechanical switch state and is in an open position when in the second mechanical switch state. In the illustrated embodiment, the solid-state switch 230 is in an open circuit state when in the first solid-state switch state and is in a closed circuit state when in the second solid-state switch state.

Figure 12C:
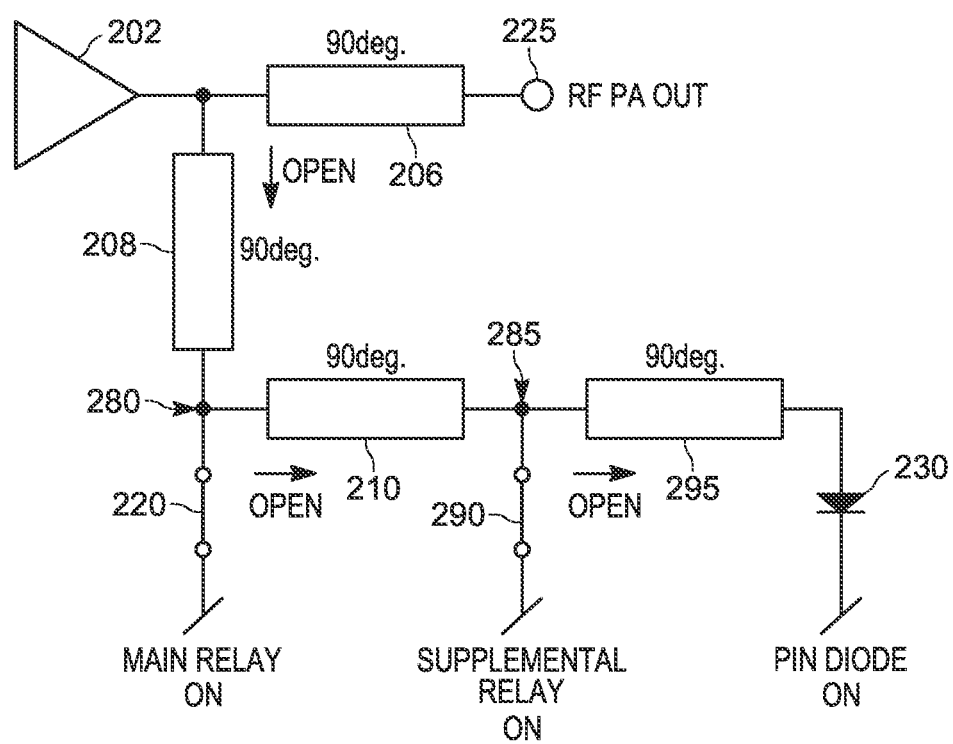
FIG. 12C is a circuit diagram illustrating selected elements of a radio frequency switching circuit including a mechanical switch, a solid-state switch, and an intermediate mechanical switch, in accordance with a tenth embodiment.

FIG. 12C is a circuit diagram illustrating selected elements of a radio frequency switching circuit 1201 including a mechanical switch, a solid-state switch, and an intermediate mechanical switch, in accordance with a tenth embodiment. In the illustrated embodiment, radio frequency switching circuit 1201 includes elements similar to those of radio frequency switching circuit 1200 illustrated in FIGS. 12A and 12B. In addition, radio frequency switching circuit 1201 includes an intermediate mechanical switch, shown as supplemental relay 290, and an additional transmission cable 295. In the illustrated embodiment, the solid-state switch 230 enables the intermediate mechanical switch 290 to be safely hot-switched, which in turn enables the mechanical switch 220 to be safely hot-switched.

As is the case with radio frequency switching circuit 1200 illustrated in FIGS. 12A and 12B, in the PA enabled state, PA 202 delivers power to RF PA OUT 225 and any subsequent component(s) in the first transmission path that includes power amplifier 202 and RF PA OUT 225. In the PA disabled state, PA 202 is decoupled from PA RF OUT 225 and any subsequent component(s).

In the illustrated embodiment, the mechanical switch 220 and the intermediate mechanical switch 290 are mechanical relays and the solid-state switch 230 is a PIN diode switch. In other embodiments, the solid-state switch 230 may be or include another type of solid-state switch, such as a MOSFET, a bipolar junction transistor (BJT), or another type of transistor that can be operated in a switched fashion. In other embodiments, either or both of the mechanical switch 220 and the intermediate mechanical switch 290 may be or include another type of electromechanically actuated switch having one or more poles, rather than a mechanical relay.

In the illustrated embodiment, transmission cable 206 represents an ideal 90-degree transmission line in the first transmission path between power amplifier 202 and the output of RF switching circuit 200, shown as RF PA OUT 225. Transmission cable 208 represents an ideal 90-degree transmission line in a third transmission path between power amplifier 202 and intermediate mechanical switch 290, transmission cable 295 represents an ideal 90-degree transmission line in a fourth transmission path between power amplifier 202 and solid-state switch 230. In the illustrated embodiment, the intermediate mechanical switch 290 is positioned in the third transmission path and the solid-state switch 230 is positioned in the fourth transmission path parallel to the third transmission path. This embodiment additionally may be configured to operatively decouple the output path of the power amplifier 202 from the subsequent component while no electrical power is supplied to the solid-state switch 230.

In the illustrated embodiment, the mechanical switch 220 serves as the primary switching control for the RF switching circuit, the solid-state switch 230 is configured to affect the intermediate mechanical switch 290 directly, and the intermediate mechanical switch 290 is configured to protect the mechanical switch 220 during transitions of the state of the mechanical switch 220. Mechanical switch 220 is configured to couple the output path of power amplifier 202 in a first transmission path to the subsequent component when in a first mechanical switch state and to decouple the output path of the power amplifier from the subsequent component when in a second mechanical switch state. However, unlike in radio frequency switching circuit 1200 illustrated in FIGS. 12A and 12B, the solid-state switch 230 is configured to impart a low impedance at a pin of the intermediate mechanical switch 290, shown as decoupling point 285, rather than at a pin of the mechanical switch 220, when in a first solid-state switch state and to impart a higher impedance at the pin of the intermediate mechanical switch 290 when in a second solid-state switch state.

When the solid-state switch 230 is in the second solid-state switch state, the state of the intermediate mechanical switch 290 affects the impedance at a pin of mechanical switch 220, shown as decoupling point 280. For example, the solid-state switch 230 is configured to be in the first solid-state switch state during transitions of the intermediate mechanical switch 290 from the first mechanical switch state to the second mechanical switch state and from the second mechanical switch state to the first mechanical switch state. When the solid-state switch 230 is in the second solid-state switch state and the intermediate mechanical switch 290 is in an OFF state, a low impedance is imparted at the decoupling point 280, operatively decoupling the mechanical switch 220 from an RF power source in the second transmission path between power amplifier 202 and mechanical switch 220.

In at least some embodiments, during a switching operation using the RF switching circuit 1201 shown in FIG. 12C, the order of the operations may be as follows: 1) the solid-state switch shown as PIN diode 230 is transitioned to its OFF state, thus shorting the intermediate mechanical switch shown as supplemental relay 290; 2) the supplemental relay 290 is transitioned to its OFF state; 3) the PIN diode 230 is transitioned to its ON state, thereby presenting a high impedance at 285 at the intermediate mechanical switch, which along with the high impedance presented by the intermediate mechanical switch itself at 285, creates a composite high impedance, thereby shorting 280 and operatively decoupling RF power to the mechanical switch shown as main relay 220; 4) the main relay 220 is transitioned from its current state to the opposite state (e.g., from its ON state to its OFF, or vice versa); 5) the PIN diode 230 is transitioned to its OFF state; 6) the supplemental relay 290 is returned to its ON state; and 7) the PIN diode 230 is returned to its ON state.

The example RF switching circuit illustrated in FIG. 12C may have an overall performance substantially similar to the performance of the RF switching circuits illustrated in FIGS. 2A, 2B, 3A, 5A, 7A, 7B, 12A and 12B, but may incur additional costs due to the inclusion of an additional mechanical switch.

Figure 13:
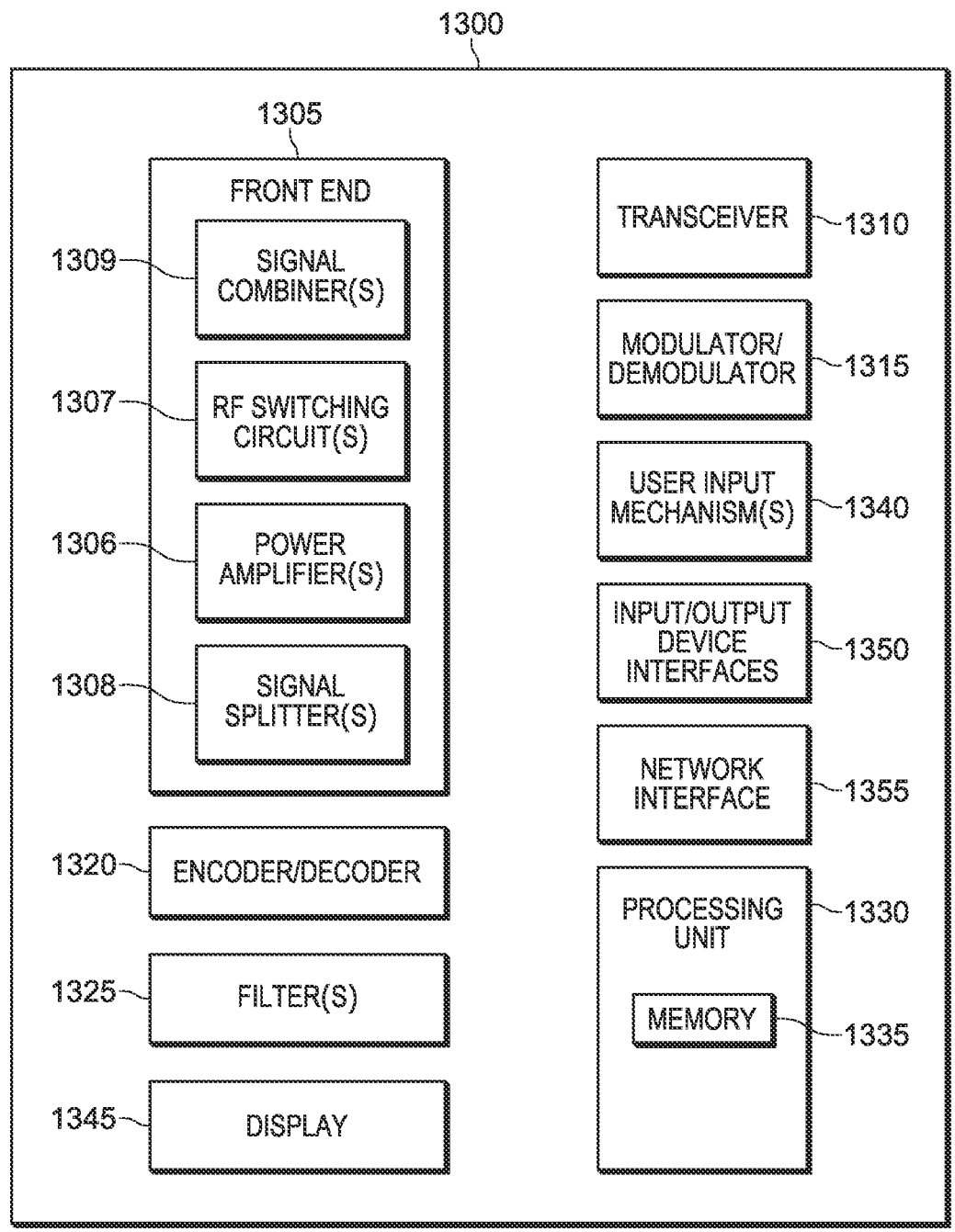
FIG. 13 is a block diagram illustrating selected elements of a system including one or more a radio frequency switching circuits, each including both a mechanical switch and a solid-state switch for hot-switching immunity, in accordance with some embodiments.

FIG. 13 is a block diagram illustrating selected elements of a system 1300 including one or more a radio frequency switching circuits, each including a mechanical switch and a solid-state switch for hot-switching immunity, in accordance with some embodiments. The illustrated components of FIG. 13, along with other various modules and components, may be coupled to each other by or through one or more control or data buses that enable communication between them. The use of control and data buses for the interconnection between and exchange of information among the various modules and components would be apparent to a person skilled in the art in view of the description provided herein. In various embodiments, system 1300 may be, or be a component of, a base station, a mobile station, or another device configured to transmit and, in some cases, receive radio frequency signals. In some embodiments, system 1300 may be integrated with an electronic communications device, for example, a portable radio, a cellular telephone, a tablet computer, and the like.

In the illustrated embodiment, system 1300 includes a front end 1305, a transceiver 1310, an encoder/decoder 1320, a modulator/demodulator 1315, one or more filters 1325, a processing unit 1330, which includes memory 1335, one or more user input mechanisms 1340, one or more input/output device interfaces 1350, a network interface 1355, and a display 1345. In other embodiments, system 1300 may include more, fewer, or different elements than those illustrated in FIG. 13.

The front end 1305 may include various digital and analog components, some of which, for brevity, are not described herein. In various embodiments, these digital and analog components may be implemented in hardware, software, or a combination of both, and may include one or more radio frequency filters, one or more signal splitters 1308, one or more signal combines 1309, radio frequency switching circuits 1307, power amplifiers 1306, and the like. The front end 1305 may include one or more wired or wireless input/output (I/O) interfaces configurable to communicate with base stations, mobile stations, or other devices configured to transmit and, in some cases, receive radio frequency signals, including radio frequency signals generated through the conversion of baseband signals. In at least some embodiments, the front end 1305 may receive radio frequency signals from an antenna communicatively coupled to the front end 1305 (not shown), optionally filter the signals using one or more radio frequency filters, and pass them to the transceiver 1310. Likewise, the front end 1305 may receive radio frequency signals from the transceiver 1310, optionally filter the signals using one or more radio frequency filters, pass the signals through one or more power amplifiers 1306 and corresponding RF switching circuits 1307, as described herein, and transmit them via the antenna. In some embodiments, system 1300 may include multiple power amplifiers 1306 and RF switching circuits 1307 in respective parallel paths and may include multiple splitter/combiner pairs 1308/1309 to route the signals, or portions thereof, to each of the parallel paths.

In various embodiments, transceiver 1310 may be or include a wireless transceiver such as a DMR transceiver, a P25 transceiver, a Bluetooth transceiver, a Wi-Fi transceiver perhaps operating in accordance with an IEEE 802.11 standard, such as 802.11a, 802.11b, or 802.11g, a WiMAX transceiver perhaps operating in accordance with an IEEE 802.16 standard, an LTE transceiver, or another similar type of wireless transceiver configurable to communicate via a wireless radio network. In some embodiments, transceiver 1310 may be or include one or more wireline transceivers 1310, such as an Ethernet transceiver, a Universal Serial Bus (USB) transceiver, or similar transceiver configurable to communicate via a twisted pair wire, a coaxial cable, a fiber-optic link or a similar physical connection to a wireline network. In various embodiments, transceiver 1310 may be or include a software defined transceiver implemented using a frequency and modulation-agile Software Defined Radio (SDR) technology. The transceiver 1310 may be coupled to combined modulator/demodulator 1315, which is coupled to encoder/decoder 1320.

In the illustrated embodiment, the transceiver 1310 receives modulated radio frequency signals, e.g., a carrier frequency signal modulated with a baseband signal, from an antenna via the front end 1305. The radio frequency signals may be modulated using any of a variety of modulation types and formats, in different embodiments and at different times. Modulator/demodulator 1315 extracts and demodulates the in-phase and quadrature baseband signals from the received modulated radiofrequency signal. The transceiver 1310 may communicate the demodulated baseband signals to encoder/decoder 1320, which decodes the signals to extract data encoded in the signals. Modulator/demodulator 1315 may receive a baseband signal encoded with data by encoder/decoder 1320 and modulate the baseband signal with a carrier signal to produce a modulated radio frequency signal. The transceiver 1310 transmits the modulated radio frequency signal via the front end 1305 and the antenna.

The processing unit 1330 may include a microprocessor, a graphics processing unit (GPU), a microcontroller, a system-on-chip, a field-programmable gate array, a programmable mixed-signal array, or, in general, any system or sub-system that includes nominal memory and that is capable of executing a sequence of instructions in order to control hardware including, for example, program instructions that control one or more RF switching circuits 1307, as described herein. In various embodiments, memory 1335 may include a Read Only Memory (ROM) and a Random Access Memory (RAM) for storing, at various times, program instructions and data for performing some or all of the methods described herein for controlling RF switching circuits that include both a mechanical switch and a solid-state switch for hot-switching immunity. For example, in various embodiments, any or all of the operations of method 100 illustrated in FIG. 1, method 400 illustrated in FIG. 4, or method 600 illustrated in FIG. 6 may be performed by program instructions executing on processing unit 1330.

Other program instructions, when executed by the processing unit 1330, may perform other functions of system 1300, such as other functionality features of a base station, mobile station, or other device configured to transmit and, in some cases, receive radio frequency signals. For example, in some embodiments, memory 1335 may also store program instructions and data for initializing system components, encoding and decoding voice, data, control, or other signals that may be transmitted or received between system 1300 and one or more base stations or mobile stations (not shown). In some embodiments, some or all of the functionality of encoder/decoder 1320 or of other elements of system 1300 shown in FIG. 13 may be implemented by program instructions executed by processing unit 1330 or another processing unit (not shown). In some embodiments, some or all of the functionality of filters 1325 may be implemented by program instructions executed by processing unit 1330 or another processing unit (not shown).

User input mechanisms 1340 may include any of a variety of suitable mechanisms for receiving user input, such as for initiating a change in the state of an RF switching circuit 1307, as described herein. User input may be provided via, for example, a keyboard or keypad, a microphone, soft keys, icons, or soft buttons on a touch screen of a display, such as display 1345, a scroll ball, a mouse, buttons, and the like.

In this example embodiment, input/output device interfaces 1350 may include one or more analog input interfaces, such as one or more analog-to-digital (A/D) convertors, or digital interfaces for receiving signals or data from, and sending signals or data to, one or more input/output devices. In some embodiments, input/output device interfaces 1350 may include a graphical user interface (GUI) generated, for example, by processing unit 1330 from program instructions and program data in memory 1335 and presented on display 1345, enabling a user to interact with display 1345. In some embodiments, input/output device interfaces 1350 may include one or more analog input interfaces for receiving baseband or radio frequency signals. In some embodiments, input/output device interfaces 1350 may include one or more external memory interfaces through which processing unit 1300 may be coupled to an external memory (not shown in FIG. 13). Such an external memory may include, for example, a hard-disk drive (HDD), an optical disk drive such as a compact disk (CD) drive or digital versatile disk (DVD) drive, a solid-state drive (SSD), a tape drive, a flash memory drive, or a tape drive, to name a few. In various embodiments, or at certain times, program data or program instructions may reside in external memory rather than, or in addition to, within memory 1335.

Display 1345 may include any suitable display technology for presenting information to a user including, for example, the state of an RF switching circuit. Each of the user input mechanisms 1340 and display 1345 may be communicatively coupled to the processing unit 1330.

Network interface 1355 may be a suitable system, apparatus, or device operable to serve as an interface between processing unit 1330 and a network. Network interface 1355 may enable processing unit 1330 to communicate over a network using a suitable transmission protocol or standard, including, but not limited to, transmission protocols and standards enumerated below with respect to the discussion of the network. In some embodiments, network interface 1355 may be communicatively coupled via a network to a network storage resource. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data or messages, which are generally referred to as data. The network may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. The network and its various components may be implemented using hardware, software, or any combination thereof.

Network interface 1355 may enable wired or wireless communications to and from processing unit 700 and other elements of a base station, mobile station, or other device. In some embodiments, baseband or radio frequency signals may be received over network interface 1355 rather than one of input/output device interfaces 1350.

Figure 14:
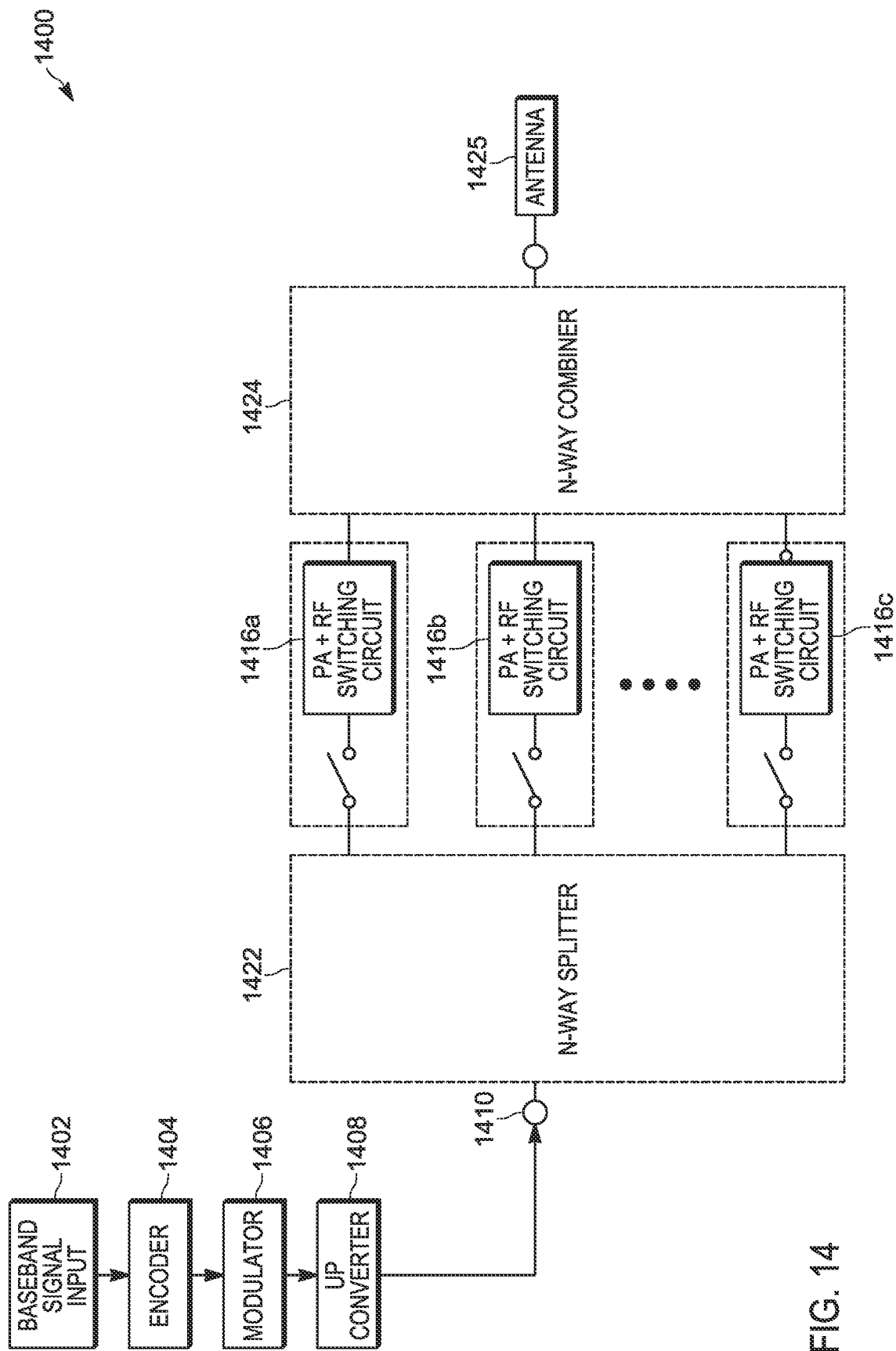
FIG. 14 is a block diagram illustrating selected elements of a transmission path in an electronic communication device including parallel power amplifiers and corresponding parallel radio frequency switching circuits, each including both a mechanical switch and a solid-state switch for hot-switching immunity, in accordance with some embodiments.

FIG. 14 is a block diagram illustrating selected elements of a transmission path in an electronic communication device including parallel power amplifiers and corresponding parallel radio frequency switching circuits, one or more of which may include a mechanical switch and a solid-state switch for hot-switching immunity, in accordance with some embodiments. For example, in some embodiments that include parallel power amplifiers, not all of the power amplifiers can be hot-switched. In such embodiments, RF switching circuits such as those described herein may only be coupled to those power amplifiers that can be hot-switched. In the illustrated embodiment the transmission path may represent a transmission path in a base station whose output is coupled to an antenna when operating in the PA enabled mode. In the illustrated example, the transmission path includes an N-way splitter 1422, N parallel RF PA branches, each including an RF switching circuit, and an N-way combiner 1424. In at least some embodiments, the impedance of the splitter 1422 and combiner 1424 may be optimized for two- and three-way operation. In other embodiments, the splitter 1422 and combiner 1424 may be configured to operate in an electronic device having a different number of parallel RF BA branches. In at least some embodiments, it may be possible to remove or disable one RF PA branch without incurring extra insertion loss, thereby maintaining the same gain as for the full N-way circuit.

In the illustrated embodiment, there is a switch at the input of each RF PA module. If one of the RF PA modules is removed or otherwise disconnected, the corresponding branch will present an open circuit at the connection points at its input and at its output. The same applies if the RF switch at the input of an RF PA module is open. At the output of an RF PA module that is disabled, the RF switch may be exposed to the RF power of the other RF PA modules. The output may therefore be exposed to hot-switching of high RF power. In the illustrated example, the electronic device may have a requirement for optimal IMD performance in both the PA enabled state and the PA disabled state. In at least some embodiments, the techniques described herein for providing an RF switching circuit with both a mechanical switch and a solid-state switch for hot-switching immunity may also allow the IMD performance requirements to be met.

In at least some embodiments, the transmission path includes a baseband input signal interface 1402, an encoder 1404, a modulator 1406, and an up-converter 1408, the output of which is an input 1410 to the parallel RF PA branches 1416, and an antenna 1425. Each of the RF PA modules 1416 includes a respective power amplifier that is coupled to or decoupled from a cable at its output dependent on the state of a corresponding RF switching circuit. Each RF switching circuit may be or include an RF circuit with both a mechanical switch and a solid-state switch in any of the topologies described herein or any other topology in which the mechanical switch serves as the primary switching control for the RF switching circuit and the solid-state switch is configured to decouple a pin of the mechanical switch from an RF power source during transitions of the state of the mechanical switch. The outputs of the RF switching circuits are coupled to N-way combiner 1424 using respective cables (not shown in FIG. 13). In one example, the N-way combiner may include cables representing ideal 90-degree transmission lines carrying signals that are combined to provide an output signal to antenna 1425.

In embodiments in which the RF switching circuits within RF PA modules 1416 include a substitution switch, as described above in reference to FIGS. 12A-12C, the RF PA may maintain a high impedance output state with or without the presence of locally-suppled electrical power. This substitution switch may be critical to maintaining isolation of the N-way combiner during a RF PA module power failure while maintaining regulatory emission limits.

Described herein are high power RF switching circuits that include a combination of a mechanical switch, such as a mechanical relay, and a solid-state switch, such as a PIN diode, with a particular sequencing of these elements to provide IMD performance and hot-switching capability that are superior to existing RF switching solutions. As noted above, the mechanical switch may reduce thermal stress on the solid-state switch during steady-state operation and may reduce or eliminate IMD that would otherwise be caused by the solid-state switch. The solid-state switch may reduce hot-switching stress on the mechanical switch during transitions from an open circuit condition to a short circuit condition or from a short circuit condition to an open circuit condition. A substitution switch maintains an open circuit impedance with or without locally supplied electrical power.

The use of the techniques described herein may allow systems and devices to meet requirements for ultra-reliable high-power RF hot-switching with low IMD at a modest cost in certain applications, such as in power amplifiers and RF communication system base stations. For example, in various embodiments, these techniques may provide a robust RF switching circuit that is immune to hot-switching with greater than 100 W RMS and greater than 1 KW peak RF power, that has high IMD performance, such as lower than −80 dBc, that has a very low cost compared to existing mechanical relays that are designed to handle high levels of hot-switching, that has high reliability, such as greater than 20 k cycles in one embodiment, and that provides high impedance output and high IMD performance with and without an available DC power supply control. In addition, because it is not necessary to use large mechanical relays with slow switching times that are inconsistent over temperature, the RF switching circuits described herein may have significant advantages over existing solutions, both in terms of absolute throwing time and variations in throwing time, making them particularly attractive for use in radio applications in which size, current drain, and temperature are important considerations.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors, or "processing devices", such as microprocessors, digital signal processors, GPUs, customized processors and field programmable gate arrays (FPGAs) and unique stored program instructions, including both software and firmware, that control the one or more processors to implement, in conjunction with certain non-processor circuits, some, most, or all of the functions of the method or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer including for example, a processor, to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:

1. A radio frequency switching circuit, comprising:
a mechanical switch, the mechanical switch configured to:
    operatively couple an output path of a power amplifier to a subsequent component when in a first mechanical switch state;
    operatively decouple the output path of the power amplifier from the subsequent component when in a second mechanical switch state, wherein:
    a first transmission path is between the output path of the power amplifier and the subsequent component;
    a second transmission path is between the output path of the power amplifier and the mechanical switch;
    the mechanical switch is not in the first transmission path; and
a solid-state switch, the solid-state switch configured to:
    operatively decouple the mechanical switch from a radio frequency power source in the first transmission path by imparting a short circuit condition at the mechanical switch when in a first solid-state switch state;
    operatively not decouple the mechanical switch from the radio frequency power source in the first transmission path by imparting an open circuit condition at the mechanical switch when in a second solid-state switch state, wherein:
    a third transmission path is between the output path of the power amplifier and the solid-state switch;
    the solid-state switch is not in the first transmission path;
    the solid-state switch is not in the second transmission path;
    the solid-state switch is configured to be in the first solid-state switch state during transitions of the mechanical switch from the first mechanical switch state to the second mechanical switch state and from the second mechanical switch state to the first mechanical switch state;
    the solid-state switch is configured to be in the second solid-state switch state when the mechanical switch is in the first mechanical switch state or the second mechanical switch state and not during the transitions of the mechanical switch from the first mechanical switch state to the second mechanical switch state and from the second mechanical switch state to the first mechanical switch state.

2. The radio frequency switching circuit of claim 1, wherein the second transmission path is parallel to the first transmission path.

3. The radio frequency switching circuit of claim 1, wherein the solid-state switch in the third transmission path is parallel to the mechanical switch in the second transmission path.

4. The radio frequency switching circuit of claim 1, wherein:
the mechanical switch is in a first position when in the first mechanical switch state; and
the mechanical switch is in a second position when in the second mechanical switch state, wherein the first position and second position are based on a length of the second transmission path.

5. The radio frequency switching circuit of claim 1, wherein:
the solid-state switch is in a first condition when in the first solid-state switch state; and
the solid-state switch is in a second condition when in the second solid-state switch state, wherein the first condition and second condition are based on a length of the third transmission path.

6. The radio frequency switching circuit of claim 1, further comprising:
a substitution switch configured to operatively decouple the output path of the power amplifier from the subsequent component while no electrical power is supplied to the solid-state switch, wherein:
the substitution switch is in a fourth transmission path;
the substitution switch is not in the first transmission path;
the substitution switch is not in the second transmission path.

7. The radio frequency switching circuit of claim 1, further comprising:
an intermediate mechanical switch, the intermediate mechanical switch configured to operatively decouple the mechanical switch from the radio frequency power source in the first transmission path when in the first solid-state switch state by:
the solid-state switch configured to operatively decouple the intermediate mechanical switch from the radio frequency power source in the first transmission path; and
the intermediate mechanical switch configured to operatively decouple the mechanical switch from the radio frequency power source in the first transmission path, wherein:
a fourth transmission path is between the output path of the power amplifier and the intermediate mechanical switch;
the second transmission path is parallel to the fourth transmission path;
the intermediate mechanical switch is not in the first transmission path;
the intermediate mechanical switch is not in the second transmission path.

8. The radio frequency switching circuit of claim 1, wherein the mechanical switch is coupled directly to a low-impedance node when the solid-state switch is configured to be in the first solid-state switch state.

9. The radio frequency switching circuit of claim 1, wherein:
a length of the second transmission path is an odd multiple of approximately 90 degrees;
the first position of the mechanical switch when in the first mechanical switch state is a closed position; and
the second position of the mechanical switch when in the second mechanical switch state is an open position.

10. The radio frequency switching circuit of claim 4, wherein:
the length of the second transmission path is an odd multiple of approximately 90 degrees;
the first position of the mechanical switch when in the first mechanical switch state is a closed position; and
the second position of the mechanical switch when in the second mechanical switch state is an open position.

11. The radio frequency switching circuit of claim 4, wherein:
the length of the second transmission path is an even multiple of approximately 90 degrees;
the first position of the mechanical switch when in the first mechanical switch state is an open position; and
the second position of the mechanical switch when in the second mechanical switch state is a closed position.

12. The radio frequency switching circuit of claim 5, wherein:
the length of the third transmission path is an odd multiple of approximately 90 degrees;
the first condition of the solid-state switch when in the first solid-state switch state is an open condition; and
the second condition of the solid-state switch when in the second solid-state switch state is a closed condition.

13. The radio frequency switching circuit of claim 5, wherein:
the length of the third transmission path is an even multiple of approximately 90 degrees;
the first condition of the solid-state switch when in the first solid-state switch state is a closed condition; and
the second condition of the solid-state switch when in the second solid-state switch state is an open condition.

14. The radio frequency switching circuit of claim 6, wherein the substitution switch in the fourth transmission path is parallel to the solid-state switch in the third transmission path.

15. The radio frequency switching circuit of claim 6, wherein the substitution switch comprises an additional mechanical switch whose position when configured to operatively decouple the output path of the first power amplifier from the subsequent component is dependent on the length of the fourth transmission path.

16. A method for operating a radio frequency switching circuit, comprising:
enabling an output path of a power amplifier to a subsequent component by:
configuring a solid-state switch to be in a first solid-state switch state to decouple a mechanical switch from a radio frequency power source by imparting a short circuit condition at the mechanical switch;
toggling the mechanical switch to a first mechanical switch state to couple the output path of the power amplifier to the subsequent component, wherein:
a first transmission path is between the output path of the power amplifier and the subsequent component;
a second transmission path is between the output path of the power amplifier and the mechanical switch;
a third transmission path is between the output path of the power amplifier and the solid-state switch;

the second transmission path is parallel to the first transmission path;
the solid-state switch in the third transmission path is parallel to the mechanical switch in the second transmission path;
the solid-state switch is not in the first transmission path;
the solid-state switch is not in the second transmission path;
the mechanical switch is not in the first transmission path;
configuring the solid-state switch to be in a second solid-state switch state to operatively not decouple the mechanical switch from the radio frequency power source by imparting an open circuit condition at the mechanical switch, wherein:
a first condition of the solid-state switch when in the first solid-state switch state and a second condition of the solid-state switch when in the second solid-state switch state are based on a length of the third transmission path; and
disabling the output path of the power amplifier to the subsequent component by:
configuring the solid-state switch to be in the first solid-state switch state to decouple the mechanical switch from the radio frequency power source by imparting the short circuit condition at the mechanical switch;
toggling the mechanical switch to a second mechanical switch state to decouple the output path of the power amplifier from the subsequent component, wherein:
a first position of the mechanical switch when in the first mechanical switch state and a second position of the mechanical switch when in the second mechanical switch state are based on a length of the second transmission path;
configuring the solid-state switch to be in the second solid-state switch state to operatively not decouple the mechanical switch from the radio frequency power source by imparting the open circuit condition at the mechanical switch.

17. The method of claim 16, wherein:
the length of the second transmission path is an odd multiple of approximately 90 degrees;
the first position of the mechanical switch when in the first mechanical switch state is a closed position; and
the second position of the mechanical switch when in the second mechanical switch state is an open position.

18. The method of claim 16, wherein:
the length of the second transmission path is an even multiple of approximately 90 degrees;
the first position of the mechanical switch when in the first mechanical switch state is an open position; and
the second position of the mechanical switch when in the second mechanical switch state is a closed position.

19. The method of claim 16, wherein the disabling of the output path of the power amplifier to the subsequent component further comprises:
configuring a substitution switch to operatively decouple the output path of the power amplifier from the subsequent component while no electrical power is supplied to the solid-state switch, wherein:
the substitute switch is in a fourth transmission path;
the substitute switch is not in the first transmission path;
the substitute switch is not in the second transmission path.

20. The method of claim 16, wherein:
when no electrical power is supplied to the solid-state switch:
toggling a substitution switch to a first substitution switch state to operatively decouple the mechanical switch from the radio frequency power source by imparting the short circuit condition at the mechanical switch; and
toggling the substitution switch to a second substitution switch state to operatively not decouple the mechanical switch from the radio frequency power source by imparting the open circuit condition at the mechanical switch, wherein:
the substitution switch is in a fourth transmission path;
the substitution switch in the fourth transmission path parallel to the solid-state switch in the third transmission path; and
the substitution switch comprises an additional mechanical switch whose position when configured to operatively decouple the mechanical switch from the radio frequency power source is dependent on the length of the fourth transmission path.

21. An electronic communication device, comprising:
a power amplifier; and
a radio frequency switching circuit, comprising:
a mechanical switch, the mechanical switch configured to:
operatively couple an output path of the power amplifier to an antenna when in a first mechanical switch state;
operatively decouple the output path of the power amplifier from the antenna when in a second mechanical switch state, wherein:
a first transmission path is between the output path of the power amplifier and the antenna;
a second transmission path is between the output path of the power amplifier and the mechanical switch;
the second transmission path is parallel to the first transmission path;
the mechanical switch is not in the first transmission path;
the mechanical switch is in a first position when in the first mechanical switch state and a second position when in the second mechanical switch state, the first position and second position based on a length of the second transmission path; and
a solid-state switch, the solid-state switch configured to:
operatively decouple the mechanical switch from a radio frequency power source in the first transmission path by imparting a short circuit condition at the mechanical switch when in a first solid-state switch state;
operatively not decouple the mechanical switch from the radio frequency power source in the first transmission path by imparting an open circuit condition at the mechanical switch when in a second solid-state switch state, wherein:
a third transmission path is between the output path of the power amplifier and the solid-state switch;
the solid-state switch in the third transmission path is parallel to the mechanical switch in the second transmission path;

the solid-state switch is not in the first transmission path;

the solid-state switch is not in the second transmission path;

the solid-state switch is in a first condition when in the first solid-state switch state and a second condition when in the second solid-state switch state, wherein the first condition and second condition are based on a length of the third transmission path;

the solid-state switch is configured to be in the first solid-state switch state during transitions of the mechanical switch from the first mechanical switch state to the second mechanical switch state and from the second mechanical switch state to the first mechanical switch state;

the solid-state switch is configured to be in the second solid-state switch state when the mechanical switch is in the first mechanical switch state or the second mechanical switch state and not during the transitions of the mechanical switch from the first mechanical switch state to the second mechanical switch state and from the second mechanical switch state to the first mechanical switch state.

22. The electronic communication device of claim 21, wherein:

the length of the second transmission path is an odd multiple of approximately 90 degrees;

the first position of the mechanical switch when in the first mechanical switch state is a closed position; and the second position of the mechanical switch when in the second mechanical switch state is an open position.

23. The electronic communication device of claim 21, wherein:

the length of the second transmission path is an even multiple of approximately 90 degrees;

the first position of the mechanical switch when in the first mechanical switch state is an open position; and the second position of the mechanical switch when in the second mechanical switch state is a closed position.

24. The electronic communication device of claim 21, wherein:

the radio frequency switching circuit further comprises a substitution switch configured to operatively decouple the output path of the power amplifier from the antenna while no electrical power is supplied to the solid-state switch, wherein:

the substitution switch is in a fourth transmission path;

the substitution switch in the fourth transmission path parallel to the solid-state switch in the third transmission path;

the substitution switch is not in the first transmission path;

the substitution switch is not in the second transmission path; and the substitution switch comprises an additional mechanical switch whose position when configured to operatively decouple the output path of the first power amplifier from the antenna is dependent on the length of the fourth transmission path.

25. A radio frequency switching circuit, comprising:

a mechanical switch, the mechanical switch configured to:

operatively couple an output path of a power amplifier to a subsequent component when in a first mechanical switch state;

operatively decouple the output path of the power amplifier from the subsequent component when in a second mechanical switch state, wherein:

a first transmission path is between the output path of the power amplifier and the subsequent component;

a second transmission path is between the output path of the power amplifier and the mechanical switch;

the mechanical switch is not in the first transmission path;

the second transmission path is parallel to the first transmission path;

a first position of the mechanical switch when in the first mechanical switch state and a second position of the mechanical switch when in the second mechanical switch state are based on a length of the second transmission path; and a solid-state switch, the solid-state switch configured to:

operatively decouple the mechanical switch from a radio frequency power source in the first transmission path by imparting a short circuit condition at the mechanical switch when in a first solid-state switch state;

operatively not decouple the mechanical switch from the radio frequency power source in the first transmission path by imparting an open circuit condition at the mechanical switch when in a second solid-state switch state, wherein:

a third transmission path is between the output path of the power amplifier and the solid-state switch;

the solid-state switch is not in the first transmission path;

the solid-state switch is not in the second transmission path;

the solid-state switch in the third transmission path is parallel to the mechanical switch in the second transmission path;

a first condition of the solid-state switch when in the first solid-state switch state and a second condition of the solid-state switch when in the second solid-state switch state are based on a length of the third transmission path;

the solid-state switch is configured to be in the first solid-state switch state during transitions of the mechanical switch from the first mechanical switch state to the second mechanical switch state and from the second mechanical switch state to the first mechanical switch state;

the solid-state switch is configured to be in the second solid-state switch state when the mechanical switch is in the first mechanical switch state or the second mechanical switch state and not during the transitions of the mechanical switch from the first mechanical switch state to the second mechanical switch state and from the second mechanical switch state to the first mechanical switch state.

* * * * *